(12) United States Patent
Anezaki et al.

(10) Patent No.: US 6,410,423 B1
(45) Date of Patent: Jun. 25, 2002

(54) SEMICONDUCTOR DEVICE AND MANUFACTURING METHOD THEREOF

(75) Inventors: Toru Anezaki; Shinichiroh Ikemasu, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/696,945

(22) Filed: Oct. 27, 2000

(30) Foreign Application Priority Data

Oct. 27, 1999 (JP) .......................................... 11-304936
Oct. 24, 2000 (JP) ....................................... 2000-323479

(51) Int. Cl.[7] ................. H01L 21/4763; H01L 21/8242
(52) U.S. Cl. ...................... 438/637; 438/639; 438/673; 438/253; 438/396
(58) Field of Search ................................ 438/637–640, 438/673, 701, 253–254, 256, 396–397, 399

(56) References Cited

U.S. PATENT DOCUMENTS

| | | | | |
|---|---|---|---|---|
| 5,389,560 A | * | 2/1995 | Park ........................... | 438/397 |
| 5,460,996 A | * | 10/1995 | Ryou .......................... | 438/254 |
| 5,780,338 A | * | 7/1998 | Jeng et al. ................... | 438/253 |
| 6,040,242 A | * | 3/2000 | Kakehashi .................... | 438/672 |
| 6,054,394 A | * | 4/2000 | Wang .......................... | 438/753 |
| 6,063,548 A | * | 5/2000 | Chu et al. .................... | 430/314 |
| 6,087,216 A | * | 7/2000 | Wang .......................... | 438/253 |
| 6,107,132 A | * | 8/2000 | Wang et al. .................. | 438/238 |
| 6,143,603 A | * | 11/2000 | Ding ........................... | 438/253 |
| 6,159,820 A | * | 12/2000 | Park ........................... | 438/396 |
| 6,164,850 A | * | 12/2000 | Speakman ............. | 400/120.09 |
| 6,174,782 B1 | * | 1/2001 | Lee ............................. | 438/396 |
| 6,239,022 B1 | * | 5/2001 | Seo et al. .................... | 438/629 |

OTHER PUBLICATIONS

Wolf "silicon processing for the VLSI Era" 1986, vol. 1 pp. 191–194.*

* cited by examiner

*Primary Examiner*—Charles Bowers
*Assistant Examiner*—Thanh Nguyen
(74) *Attorney, Agent, or Firm*—Armstrong, Westerman Hattori, LLP

(57) ABSTRACT

A semiconductor device comprises a first insulating film formed over a semiconductor substrate, a second insulating film formed on the first insulating film, a contact plug made of a conductive material vertically penetrating the first and second insulating films and extending on the second insulating film, and a conductor film in contact with the upper surface of the contact plug and part of the second insulating film. This construction makes it possible to form minute via-holes in a mass-production line without increasing parasitic capacity, increasing the number of manufacturing steps, and generating defects.

15 Claims, 27 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, in particular, characterized by a stack structure of insulating layers which permits formation of minute via-holes without defects through a low-temperature process in a semiconductor highly-integrated circuit device such as a hybrid system LSI including a DRAM (Dynamic Random Access Memory).

2. Description of the Related Art

In recent progress of integration of semiconductor integrated circuit devices, SAC (Self-Align Contact) method, MDC (Modified Contact) method, PSC (Poly Shrink Contact) method, etc., are known for forming a minute via-hole in the manner that an opening portion is formed in an insulating layer interposed between interconnection layers. These methods of forming via-holes will be described below with reference to FIGS. 1A through 1C to FIGS. 4A through 4C.

First, a conventional SAC process will be described with reference to FIGS. 1A through 1C.

Referring first to FIG. 1A, interconnection lines 52 for, e.g., bit lines, are formed on an insulating underlayer 51 made of, e.g., SiO$_2$, according to a design rule of 0.16 $\mu$m/0.24 $\mu$m for line/space. A SiN film is then formed by deposition, and anisotropically etched to form spacers 54.

In this case, for surely forming a certain space between the interconnection lines 52, the thickness of the SiN film must be 0.12 $\mu$m or less.

Note that, on the upper surface of each interconnection line 52, another SiN film 53 has been formed prior to the formation of the above-described SiN film. Besides, an electrode plug (not shown) has been provided at the portion in the insulating underlayer 51 corresponding to the space between the interconnection lines 52.

A thick insulating interlayer 55 made of, e.g., BPSG, is then formed on the entire surface by deposition. The surface of the insulating interlayer 55 is flattened through a CMP (Chemical Mechanical Polishing) or etch-back process. A resist pattern (not shown) for 0.24 $\mu$m-wide via-holes is formed using a photolithographic technique. Anisotropic etching is carried out using the SiN films 53 and the spacers 54 as etching stoppers, to form a via-hole 56.

Referring next to FIG. 1B, a thick amorphous Si layer 57 doped with, e.g., P (phosphorus), is formed on the entire surface by deposition.

Referring next to FIG. 1C, polishing by CMP method is carried out until the surface of the insulating interlayer 55 is exposed. The part of the doped amorphous Si layer 57 formed on the insulating interlayer 55 is thereby removed to form a Si plug 58 filling in the via-hole 56.

Next, a conventional MDC process will be described with reference to FIGS. 2A through 2D.

Referring first to FIG. 2A, interconnection lines 52 for, e.g., bit lines, are formed on an insulating underlayer 51 made of, e.g., SiO$_2$, according to a design rule of 0.16 $\mu$m/0.24 $\mu$m for line/space. A thick insulating interlayer 55 made of, e.g., BPSG, is then formed on the entire surface by deposition. The surface of the insulating interlayer 55 is flattened through a CMP or etch-back process. A resist pattern (not shown) for 0.24 $\mu$m-wide via-holes is formed using a photolithographic technique. Anisotropic etching is carried out using the interconnection lines 52 as etching stoppers, to form a via-hole 56.

An electrode plug (not shown) has been provided at the portion in the insulating underlayer 51 corresponding to the space between the interconnection lines 52.

Referring next to FIG. 2B, an insulating film 59 made of, e.g., SiN, having an etching selectivity to the BPSG film, is formed by deposition.

In this case, for surely forming a certain space between the interconnection lines 52 in the subsequent anisotropic etching process, the thickness of the insulating film 59 must be 0.12 $\mu$m or less, in particular, 0.1 $\mu$m or less.

Referring next to FIG. 2C, anisotropic etching is carried out to form spacers 60, which newly define a via-hole 61 between them.

Referring next to FIG. 2D, a thick amorphous Si layer doped with, e.g., P (phosphorus), is formed on the entire surface by deposition. Polishing by CMP method is then carried out until the surface of the insulating interlayer 55 is exposed. The part of the doped amorphous Si layer formed on the insulating interlayer 55 is thereby removed to form a Si plug 62 filling in the via-hole 61.

Next, a conventional PSC process will be described with reference to FIGS. 3A through 3C and 4A through 4C.

Referring first to FIG. 3A, interconnection lines 52 for, e.g., bit lines, are formed on an insulating underlayer 51 made of, e.g., SiO$_2$, according to a design rule of 0.16 $\mu$m/0.24 $\mu$m for line/space. A thick insulating interlayer 55 made of, e.g., BPSG, is then formed on the entire surface by deposition. The surface of the insulating interlayer 55 is flattened through a CMP or etch-back process. An amorphous Si layer 63 having an etching selectivity to the insulating interlayer 55 is then formed on the entire surface by deposition, into a thickness of, e.g., 0.3 $\mu$m.

An electrode plug (not shown) has been provided at the portion in the insulating underlayer 51 corresponding to the space between the interconnection lines 52.

Referring next to FIG. 3B, a resist pattern (not shown) for 0.24 $\mu$m-wide via-holes is formed using a photolithographic technique. Anisotropic etching is then carried out using the insulating in interlayer 55 as an etching stopper, to form an opening portion 64 in the amorphous Si layer 63.

Referring next to FIG. 3C, another amorphous Si layer is formed on the entire surface by deposition, into a thickness of, e.g., 0.12 $\mu$m or less. Anisotropic etching is then carried out to form Si spacers 65, which newly define an opening portion 66 between them.

Referring next to FIG. 4A, anisotropic etching is carried out using the amorphous Si layer 63 and the Si spacers 65 as etching masks, to form a via-hole 67.

Referring next to FIG. 4B, a thick amorphous Si layer 68 doped with, e.g., P (phosphorus), is formed on the entire surface by deposition.

Referring next to FIG. 4C, polishing by CMP method is carried out until the surface of the insulating interlayer 55 is exposed. The part of the doped amorphous Si layer 68 formed on the insulating interlayer 55 is thereby removed to form a Si plug 69 filling in the via-hole 67.

Next, a manufacturing method of a conventional hybrid system LSI including a DRAM will be described with reference to FIGS. 5A and 5B to FIGS. 14A and 14B, in which a via-hole for a storage node is formed through a PSC process among techniques for forming such a via-hole in a self aligning manner.

FIGS. 5A, 7A, 9A, 11A and 13A are sectional views of a memory cell portion. FIGS. 5B, 7B, 9B, 11B and 13B are sectional views of an alignment mark portion at the same stages as those of FIGS. 5A, 7A, 9A, 11A and 13A, respectively. FIGS. 6A, 8A, 10A, 12A and 14A are sectional views perpendicular to those of FIGS. 5A, 7A, 9A, 11A and 13A, respectively. FIGS. 6B, 8B, 10B, 12B and 14B are sectional views of a logic transistor portion.

Referring first to FIGS. 5A to 6B, electrically insulating regions 72 for element isolation are formed in a p-type silicon substrate 71 through an STI (Shallow Trench Isolation) process.

The p-type silicon substrate 71 may be substituted by a p-type well formed in an n- or p-type silicon substrate. Besides, channel stop regions or doped channel regions may be formed therein through an ion implantation process, at need.

Next, a gate oxide film 73 is formed by thermal oxidation using wet $O_2$ gas. An amorphous Si film is then formed by deposition into a thickness of, e.g., 100 nm. The amorphous Si film is doped with As or P by ion implantation. A conductive Si gate electrode layer 74 is obtained thereby.

Next, a 100 nm-thick $WSi_2$ film 75 is formed by deposition, for example. Subsequently, a 100 nm-thick P-SiN film 76 is formed through a plasma CVD process, for example. After this, in the DRAM portion, patterning by etching are carried out using a photolithographic technique, according to a design rule of, e.g., 0.20 $\mu$m/0.20 $\mu$m for line/space, to form gate electrodes and word lines successive from the gate electrodes.

The length of the gate electrode in the logic transistor portion of FIG. 6B is, e.g., 0.18 $\mu$m.

Next, for n-channel FET portions, ion implantation with P is carried out. In the DRAM portion, n-type drain and source regions 77 and 78 are formed thereby. At the same time, in the logic transistor portion, n-type LDD (Lightly Doped Drain) regions 79 are formed.

Next, a SiN film 80 of a thickness of, e.g., 60 nm, is formed on the entire surface through a CVD process. After this, while masking the DRAM portion with a resist, anisotropic etching is carried out to form a spacer 81 on either side wall of the gate electrode in the logic transistor portion. Ion implantation with As is then carried out using the spacers 81 as masks, to form $n^+$-type drain and source regions 82 and 83. After this, defects attendant upon ion implantation are repaired through an RTA (Rapid Thermal Anneal) process, e.g., heat treatment at 1000° C. for 10 seconds.

Next, a Co film is formed on the entire surface by deposition, into a thickness of, e.g., 50 nm. Heat treatment at 500° C. for 30 seconds is then carried out to form silicide electrodes 84 of $CoSi_2$ only on the surfaces of the $n^+$-type drain and source regions 82 and 83.

Subsequently, etching is carried out with a mixture solution of hydrogen peroxide and ammonia or a mixture solution of sulfuric acid and hydrogen peroxide to remove unreacted Co.

Next, a SiN film 85 of a thickness of, e.g., 20 nm, is formed on the entire surface through a CVD process.

In this case, by forming the SiN film 85 in a growth device with a load lock system, oxidation of the silicide electrodes 84 by oxygen engulfed during the growth of the SiN film 85 can be successfully prevented.

Next, a BPSG film 86 is formed on the entire surface by deposition. In the DRAM portion, bit and storage contacts are then formed through an SAC process.

In this case, after a resist pattern (not shown) for 0.24 $\mu$m-wide via-holes is formed using a photolithographic technique, the BPSG film 86 is etched by double-channel RIE (Reactive Ion Etching) using $C_4F_8$+CO+Ar+$O_2$ gas. Subsequently, the SiN film 85 is etched to expose the n-type drain and source regions 77 and 78.

In this etching process, sidewalls 87 are formed on the opposed side surfaces of the gate electrodes. These sidewalls 87 prevent short circuits between the gate electrodes and Si plugs 88 and 89 which will be described later.

As the capacitance on each gate electrode, i.e., word line, the capacitance between it and the p-type silicon substrate 71 across the gate oxide film 73 is dominant. Therefore, an increase in capacitance due to use of SAC method matters little.

Next, a thick amorphous Si layer doped with, e.g., P, is formed by deposition. Polishing is then carried out until the surface of the BPSG film 86 is exposed. The part of the doped amorphous Si layer formed on the BPSG film 86 is thereby removed to form Si plugs 88 and 89 filling in via-holes.

Next, a P-$SiO_2$ film 90 of a thickness of, e.g., 100 nm, is formed on the entire surface through a plasma CVD process. A via-hole is then formed for the Si plug 88 which is to serve as a bit contact. After this, a Ti film of a thickness of, e.g., 20 nm, a TiN film of a thickness of, e.g., 50 nm, and a W film of a thickness of, e.g., 100 nm, are formed in order on the entire surface by deposition. These films are then patterned into a predetermined shape to form bit lines 91 of the Ti/TiN/W structure.

In this case, the bit lines 91 are formed according to a design rule of 0.16 $\mu$m/0.24 $\mu$m for line/space, for example.

At this time, in the alignment mark portion, alignment marks 92 of the Ti/TiN/W structure are formed, as shown in FIG. 5B.

Next, a $SiO_2$ film 93 of a thickness of, e.g., 700 nm, is formed through an HDP (High Density Plasma)-CVD process. Subsequently, the $SiO_2$ film 93 is polished by about 200 nm through a CMP process to flatten the surface of the $SiO_2$ film 93.

Referring next to FIGS. 7A to 8B, an amorphous Si layer 94 of a thickness of, e.g., 300 nm, is formed on the entire surface by deposition. The part of the amorphous Si layer 94 above the alignment marks 92 is then removed by rough patterning to form a window portion 95.

This is because the amorphous Si layer 94 is opaque in relation to visible light. That is, when such a thick amorphous Si layer 94 having its thickness of 300 nm is present above the alignment marks 92, detection of the alignment marks 92 may become impossible.

Referring next to FIGS. 9A to 10B, a resist pattern (not shown) for via-holes of a width of 0.24 $\mu$m (=240 nm) is formed using a photolithographic technique. Subsequently, anisotropic etching is carried out to form an opening portion at the position in the amorphous Si layer 94 corresponding to the Si plug 89 which is to serve as a storage contact. After this, another amorphous silicon layer of a thickness of, e.g., 95 nm, is formed on the entire surface by deposition. Subsequently, anisotropic etching is carried out to form Si spacers 95 whose maximum width is 95 nm. After this, anisotropic etching is carried out using the Si spacers 95 and the amorphous Si layer 94 as masks, to form a via-hole 98 whose minimum width is 0.05 $\mu$m (=50 nm=240 nm $-2\times95$ nm).

At this time, the alignment mark portion is covered with a resist 97, thereby preventing the $SiO_2$ film 93 at that portion from being etched off to expose the alignment marks 92.

Referring next to Figs. 11A to 12B, an amorphous Si layer of a thickness of, e.g., 200 nm, doped with, e.g., P, is formed on the entire surface by deposition. Subsequently, polishing is carried out until the surface of the $SiO_2$ film 93 is exposed through a CMP process. The part of the doped amorphous Si layer formed on the amorphous Si layer 94, the amorphous Si layer 94, and the Si spacers 95 are thereby removed to form a Si plug 99 filling in the via-hole 98.

At this time, a lower part of each Si spacer 95 may remain as a residual Si spacer portion 100.

Referring next to FIGS. 13A to 14B, an LP-SiN film 101 which is to serve as etching stoppers in the subsequent stages, is formed into a thickness of, e.g., 10 nm, through a low-pressure chemical vapor deposition (LPCVD) process. A BPSG film (not shown) of a thickness of, e.g., 1 $\mu$m, is then formed on the entire surface by deposition.

Next, the BPSG film and the LP-SiN film 101 are etched in order, to form a wide opening portion which reaches the Si plug 99 formed by PSC method. After this, an amorphous Si layer of a thickness of, e.g., 50 nm, doped with P, is formed on the entire surface by deposition. Subsequently, the part of the doped amorphous Si layer formed on the BPSG film is removed through a CMP process to form a storage node 102 having cylindrical outer and inner surfaces.

Next, the BPSG film is selectively removed with an HF aqueous solution using the LP-SiN film 101 as an etching stopper. Subsequently, a SiN film of a thickness of, e.g., 5 nm, is formed on the surface of the storage node 102 through an LPCVD process at, e.g., 700° C. The SiN film is to serve as a dielectric layer of a capacitor. After this, an amorphous Si film of a thickness of, e.g., 100 nm, doped with P, is formed on the entire surface by deposition to form a cell plate 103 common for storage nodes 102.

In the subsequent process not illustrated, an insulating interlayer is formed on the entire surface. Heat treatment by RTA method at 900° C. for 10 seconds is carried out for re-activation to ensure a certain current of each MOSFET. After this, wiring process and so on are performed. A system LSI in which a DRAM is incorporated is obtained thereby.

In the above RTA process for re-activation, since no thick plasma SiN film exists, peeling or cracking thereof never occurs.

The above-described conventional formation methods of via-holes, however, include various problems. This will be discussed below.

For example, in case of the SAC method as shown in FIGS. 1A to 1C, the device has a COB (Capacitor Over Bit-line) structure in which interconnection lines 52, i.e., bit lines, are under the capacitor. When the via-hole 56 is for a storage node contact, if the via-hole 56 is formed through a usual selective etching process with double-channel RIE using $C_4F_8$+CO+Ar+$O_2$ gas, the side surface of each interconnection line 52 must be covered with a SiN film having an etching selectivity in relation to the insulating interlayer 55 made of, e.g., BPSG.

However, such a SiN film has a high relative dielectric constant. Besides, in case of SAC method, the area of the opening of the via-hole 56 over the interconnection lines 52 cannot but be large in comparison with that of MDC or PSC method. This causes the problem that the capacitance between each bit line and the storage node increases.

For example, when the relative dielectric constant of SiN is represented by $\in$, the dielectric constant of vacuum is represented by $\in_0$, the surface area is represented by S, and the distance between the electrodes is represented by d, the capacity C of the capacitor is expressed by:

$$C=(\in \times \in_0 \times S/d)$$

The relative dielectric constant of SiN is 7.4, which is approximately double that of $SiO_2$.

Such an increase in capacity makes it hard to reduce the number of sense amplifier divisions. This causes an increase in chip area.

Next, problems in use of the MDC method as shown in FIGS. 2A to 2D will be discussed. When each spacer 60 in the via-hole 56 is made of SiN, there arises the problem of increasing the capacity between each bit line and the storage node, like the case of the above-discussed SAC method.

Otherwise, it is thinkable that each spacer 60 in the via-hole 56 is made of $SiO_2$ whose relative dielectric constant is low. In this case, however, the following problems arise. The film for forming such a spacer is required to have a good step coverage ability. On the other hand, as a demand of such a hybrid system LSI including a DRAM, in order to prevent deterioration of performance of a logic circuit because of, e.g., occurrence of short-channel effect due to change in impurity profile of source/drain regions, a low-temperature process is required for the DRAM having a COB structure. For example, a furnace annealing process at 700° C. or less is required.

As a method for forming a $SiO_2$ film with good step coverage ability through such a low-temperature process, known is LP-TEOS method capable of forming a film at 650° C. However, the LP-TEOS film formed by this method can not be densified and reduces in its anti-breakdown property unless it is subjected to a heat treatment at about 800° C. in the atmosphere of $N_2$. Therefore, this method can not be used for such a hybrid system LSI including a DRAM.

No other formation method of a $SiO_2$ film with good step coverage ability through a low-temperature process is present if mass-productivity in a factory is taken into consideration.

Next, problems in use of the PSC method as shown in FIGS. 3A to 3C and FIGS. 4A to 4C will be discussed. If a hard mask and spacers formed on the side surfaces thereof, which are to serve as etching masks, are made of polycrystalline Si, since polycrystalline Si is opaque in relation to visible light, alignment marks cannot be detected upon formation of via-holes, as described in connection with FIG. 7B.

With recent progress of minuteness in semiconductor device, resolution in photolithographic process has also been improved. Since the higher resolution requires the shallower focal depth, the surface of the insulating interlayer 55 must be flattened. If the surface has been flattened, however, unevenness in height caused by the alignment marks for photolithography may disappear, and detection of the alignment marks may become impossible through the opaque film.

For this reason, as described in connection with FIG. 7B, for removing the amorphous Si layer 93 over the alignment marks 92, two steps of resist pattern formation and etching are necessary as extra steps. Furthermore, in order to prevent the alignment marks 92 from being exposed during the formation process of the via-hole 98, a formation process of the resist 97 is necessary. These hinder a reduction of cost and a higher throughput.

Besides, in case of bit lines 91 made of a metal, if the alignment marks 92 are formed at a level of an interconnection layer lower than the bit lines 91, the alignment must be done indirectly and so the positional deviation may become large. For this reason, the alignment marks are usually formed using the bit lines 91. In this case, however, if the formation process of the resist 97 is omitted, the metal alignment marks 92 may be exposed during the formation process of the via-hole 98. This may cause a metallic contamination of the depositing device for the doped amorphous Si layer for forming the Si plug in the subsequent stage. Therefore, the device only for that process must be used. In a usual factory, however, such a limited use of the device is hard.

Consequently, when the bit lines are made of a metal, the three extra steps in total become necessary.

Further, problems in a minute via-hole formation process by the PSC method in which furnace annealing only at 700° C. or less can be carried out because metal interconnection lines exist in a lower layer as represented by a hybrid system LSI including a DRAM, will be discussed with reference to FIG. 15.

Referring to FIG. 15, when a via-hole 67 is formed in a 500 nm-thick insulating interlayer 55, an amorphous Si layer 63 as a hard mask requires its thickness of 300 nm.

This is because the plasma in the etching process for forming the via-hole 67 is apt to concentrate at corner portions, and so etching rapidly progresses in the interface between the amorphous Si layer 63 and each Si spacer 65. This may result in generation of abnormal etching portions 70.

Alternatively, when an LP-SiN film formed through an LPCVD process is used as the hard mask, 270 minutes (=4.5 hours) is required for the LP-SiN film having grown to a thickness of 300 nm at 700° C. or less. This causes a problem on throughput.

Besides, when a plasma CVD process is used for the hard mask and a BPSG film exists in the lower layer, the P-SiN film formed through the process may crack if its thickness is 100 nm or more.

More specifically, When the P-SiN film is put in a formation process of a capacitor dielectric film or a RTA process for re-activation of source/drain regions after formation Of the via-hole 67, the stress exerted on the P-SiN film changes from compression to tensile due to heat of 650° C. or more. This may cause peeling off or cracking.

SUMMARY OF THE INVENTION

It is an object of the present invention to provide a semiconductor device and a manufacturing method thereof, wherein minute via-holes can be formed in a mass-production line without increasing parasitic capacity, increasing manufacturing steps, and causing defects.

According to one aspect of the present invention, there is provided a semiconductor device comprising: a semiconductor substrate; a first insulating film formed over said semiconductor substrates a second insulating film formed on said first insulating film; a contact plug made of a conductive material, said plug vertically penetrating said first and second insulating films and extending on said second insulating film; and a conductive film in contact with the upper surface of said contact plug and part of said second insulating film.

According to another aspect of the present invention, there is provided a method of manufacturing a semiconductor device, comprising the steps of: forming a first insulating film over a semiconductor substrate; forming a second insulating film on said first insulating film; forming a third insulating film on said second insulating film, said third insulating film having a low etching rate in relation to a first etchant for said first insulating film; forming an opening portion so as to extend through said third and second insulating films up to said first insulating film; forming a spacer on the side wall of said opening portion, said spacer having a low etching rate in relation to said first etchant for said first insulating film; forming a contact hole so as to extend through said first insulating film, using said third insulating film and said spacer as masks; filling said opening portion and said contact hole with a first conductive material to form a contact plug; and selectively removing said third insulating film using a second etchant whose etching rate to said second insulating film is low.

The principal feature of the present invention is a combination of the second and third insulating films. These second and third insulating films satisfy the following conditions. A high etching selectivity can be set between the second and third insulating films. The total thickness of the second and third insulating films is sufficient for serving as a mask in etching process to form a contact hole. A film (e.g., P-SiN film) which may be peeled off in the subsequent annealing process, is formed as the upper third insulating film, and it is removed before the annealing process.

According to the present invention, upon formation of a minute via-hole, a film transparent in relation to visible light is employed as the major part of a hard mask. Therefore, additional manufacturing steps for making it possible to detect alignment marks, can be eliminated, and thereby the throughput can be improved. This greatly contributes an improvement of reliability of highly-integrated semiconductor devices such as hybrid system LSIs with DRAMs, and an improvement of yield in manufacture.

DETAILED DESCRIPTION OF THE PREFERRED EMBODIMENTS

Figure 1A:
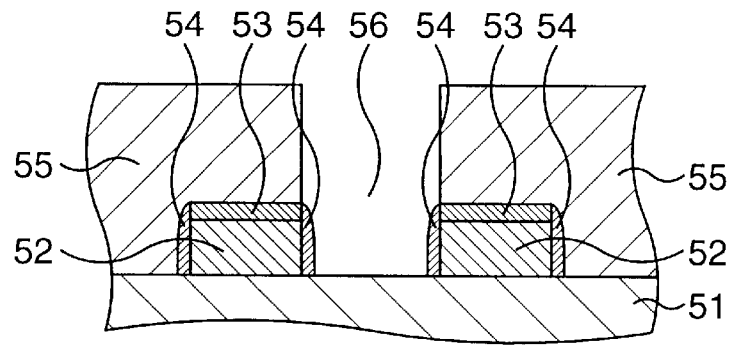
FIGS. 1A to 1C are sectional views showing a conventional SAC process in order.
Figure 1B:
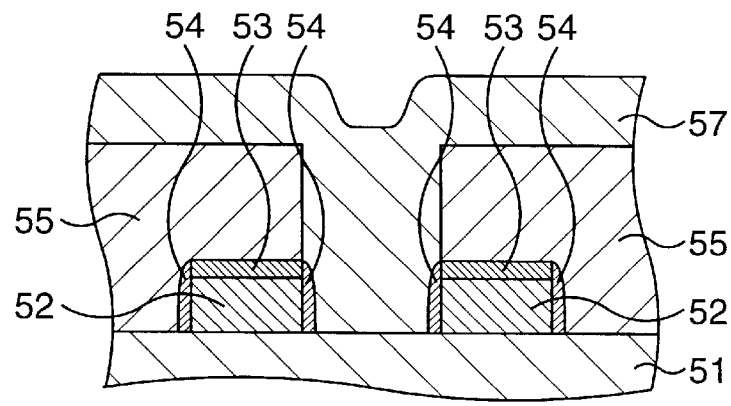
Figure 1C:
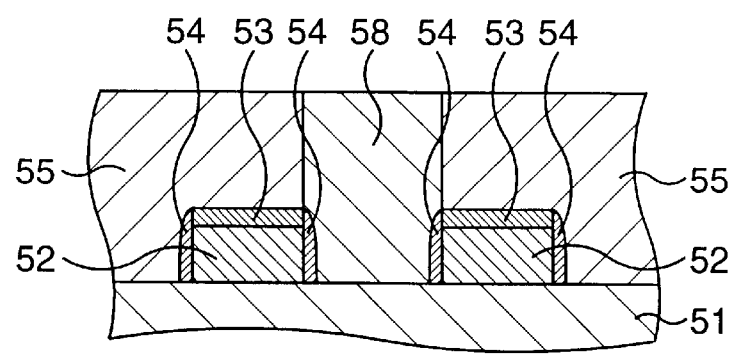
Figure 2A:
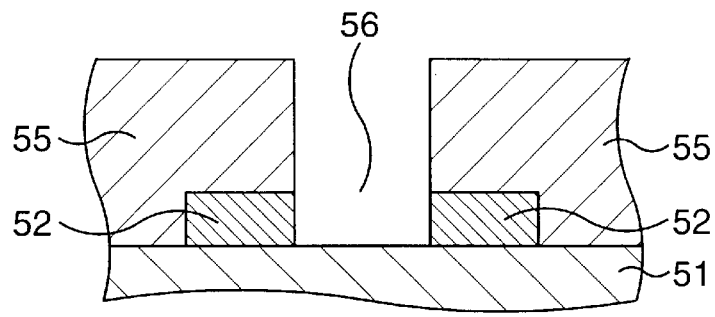
FIGS. 2A to 2D are sectional views showing a conventional MDC process in order.
Figure 2B:
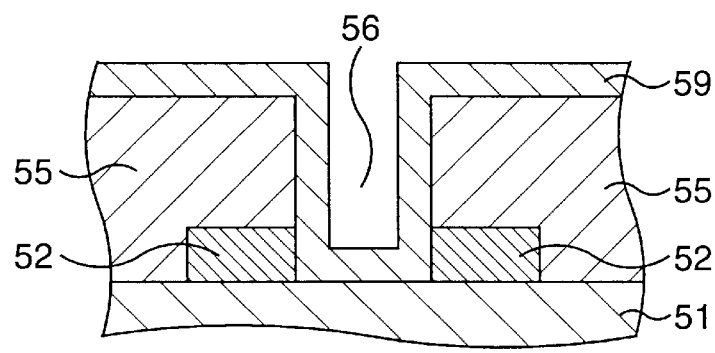
Figure 2C:
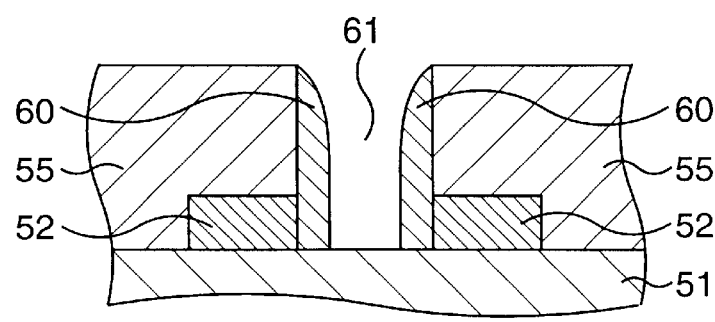
Figure 2D:
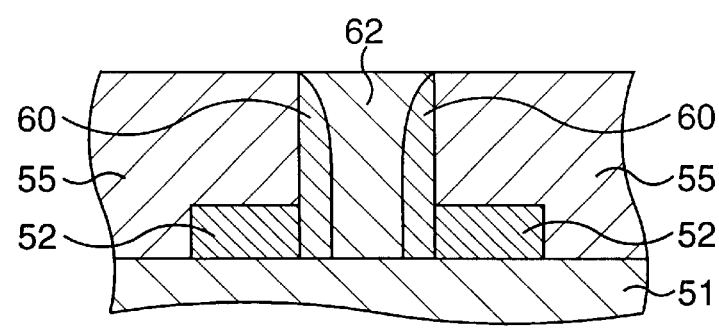
Figure 3A:
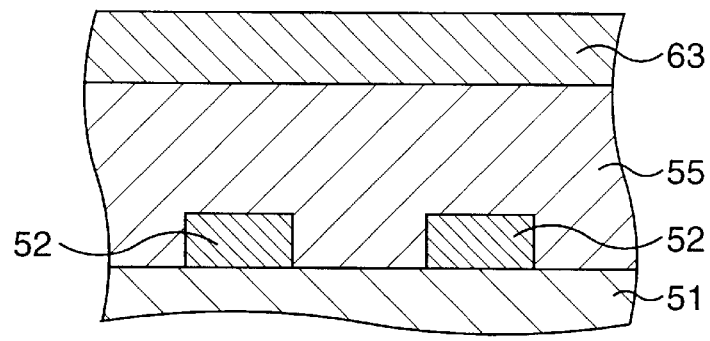
FIGS. 3A to 3C are sectional views showing manufacturing steps of a conventional PSC process.
Figure 3B:
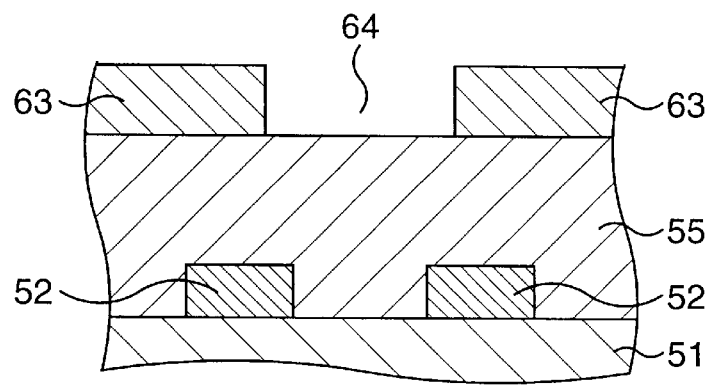
Figure 3C:
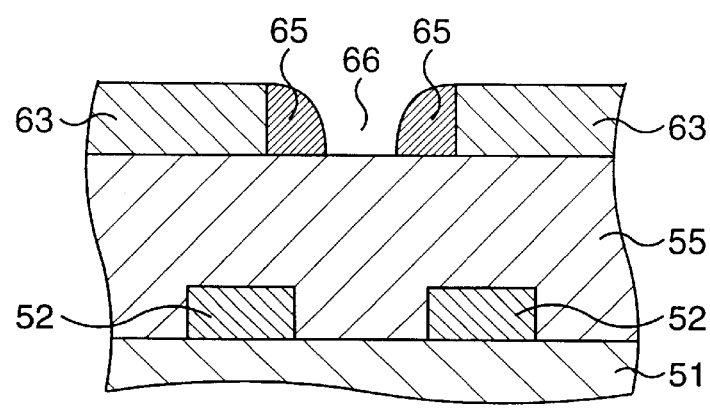
Figure 4A:
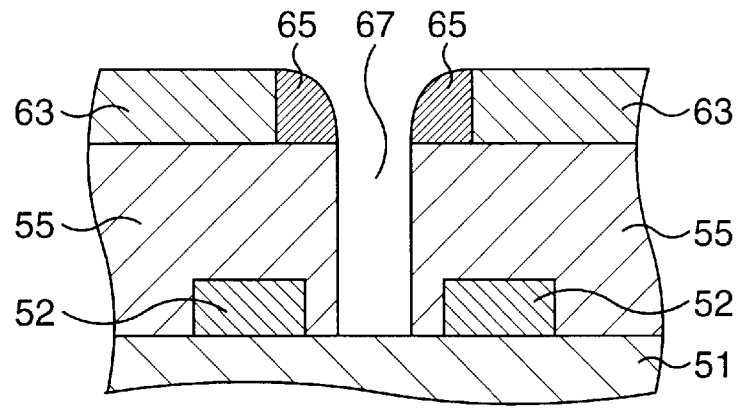
FIGS. 4A to 4C are sectional views showing manufacturing steps of the conventional PSC process subsequent to the step of FIG. 3C.
Figure 4B:
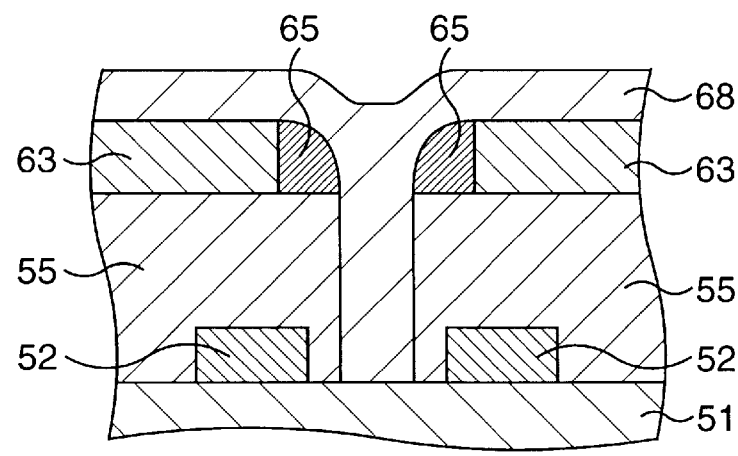
Figure 4C:
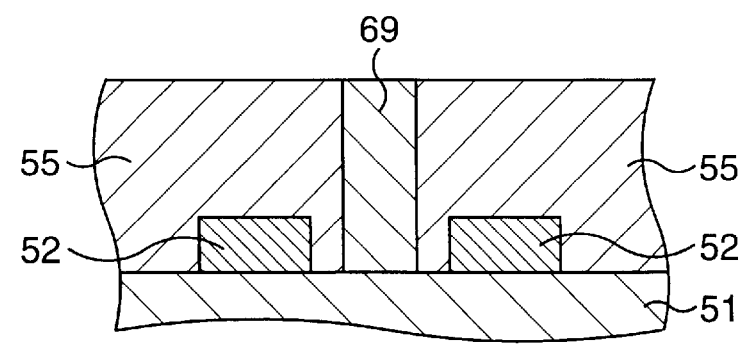
Figure 5A:
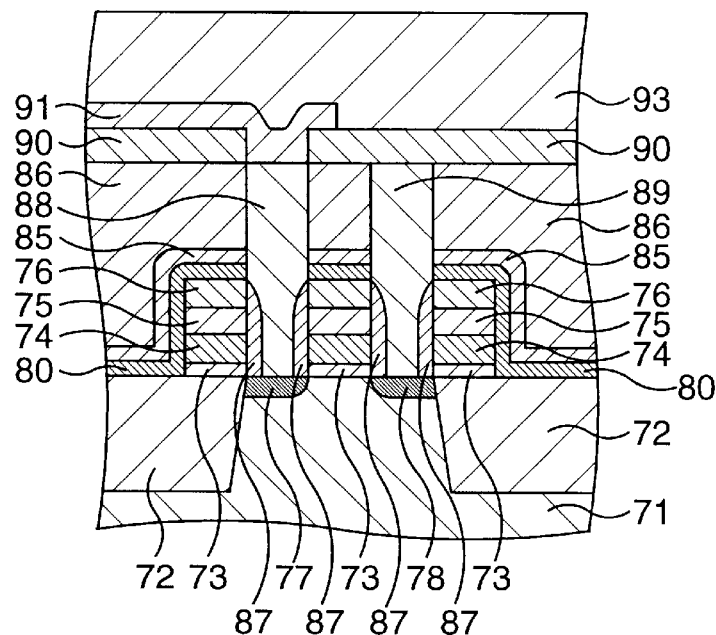
FIGS. 5A and 5B are sectional views showing a manufacturing step for a hybrid system LSI with a DRAM according to the conventional PSC process.
Figure 5B:
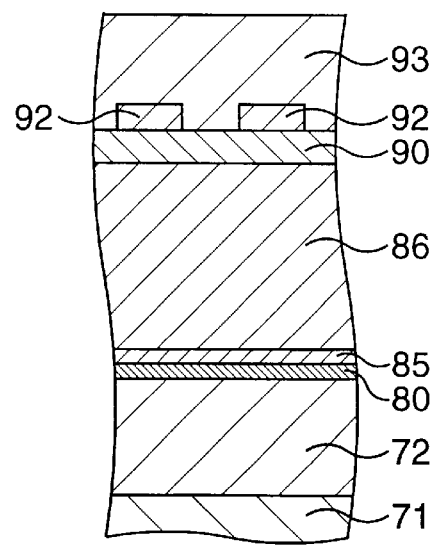
Figure 6A:
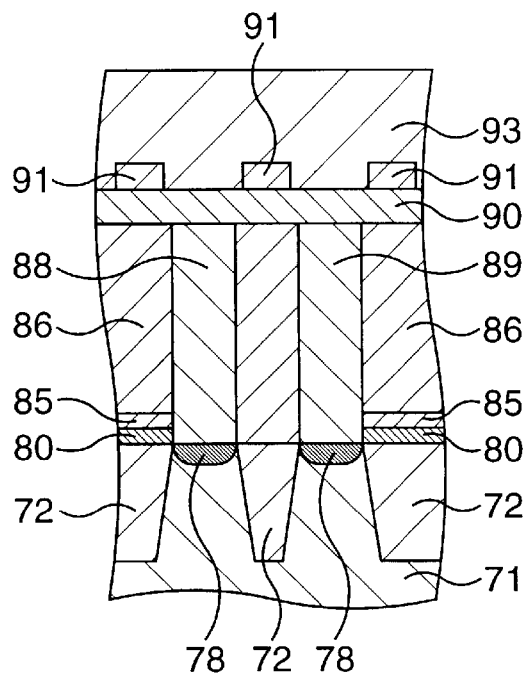
FIGS. 6A and 6B are other sectional views of the hybrid system LSI at the same manufacturing step as that of FIGS. 5A and 5B according to the conventional PSC process.
Figure 6B:
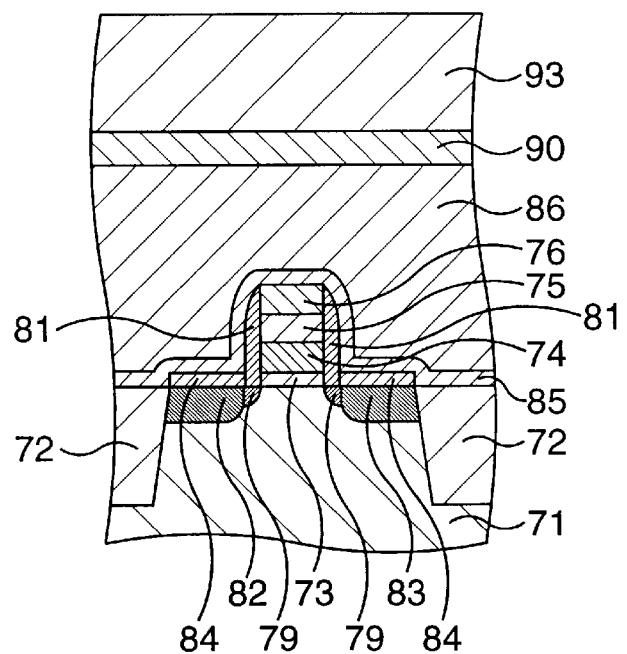
Figure 7A:
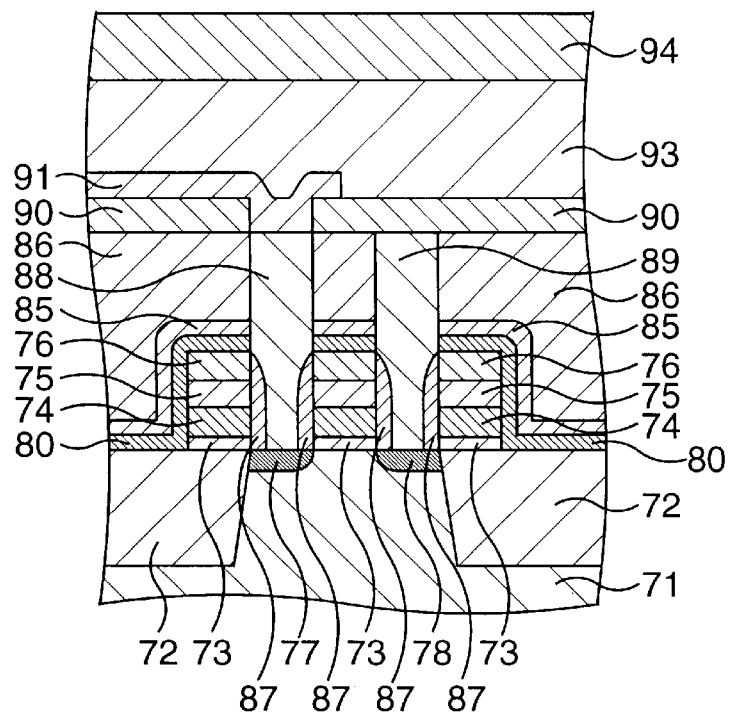
FIGS. 7A and 7B are sectional views showing a manufacturing step for the hybrid system LSI subsequent to that of FIGS. 5A and 5B according to the conventional PSC process.
Figure 7B:
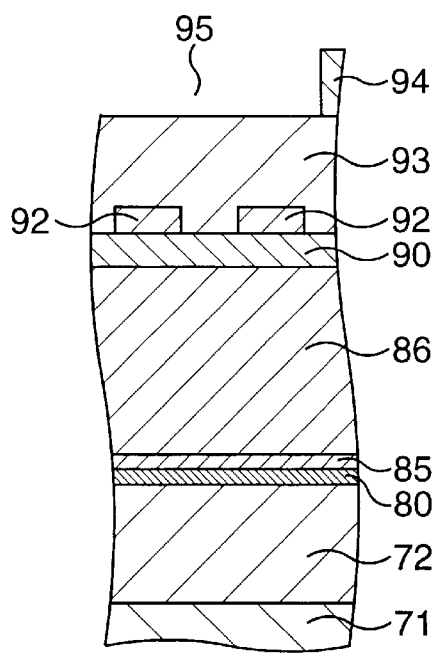
Figure 8A:
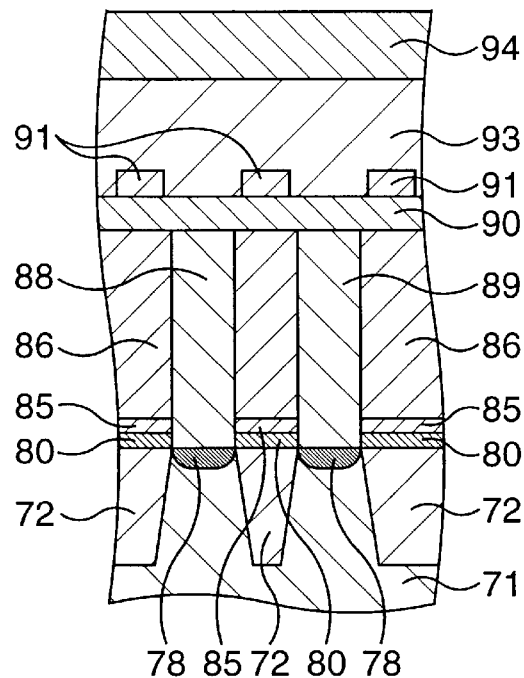
FIGS. 8A and 8B are other sectional views of the hybrid system LSI at the same manufacturing step as that of FIGS. 7A and 7B according to the conventional PSC process.
Figure 8B:
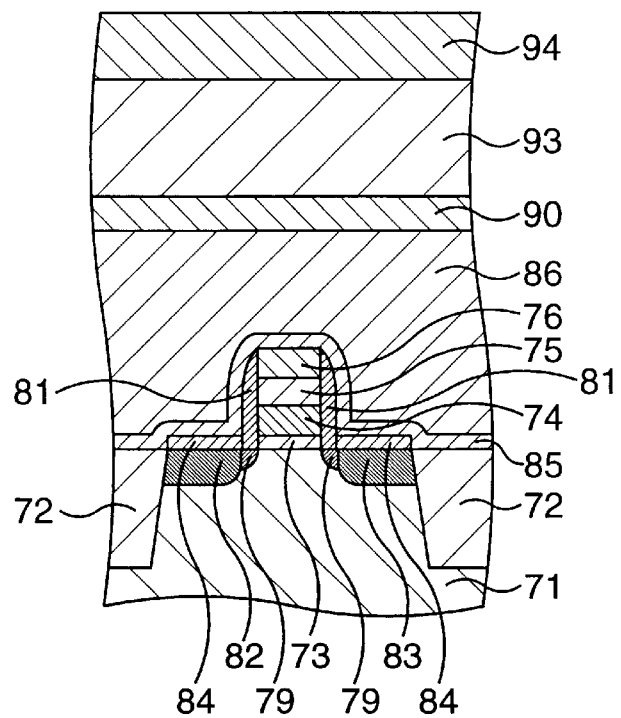
Figure 9A:
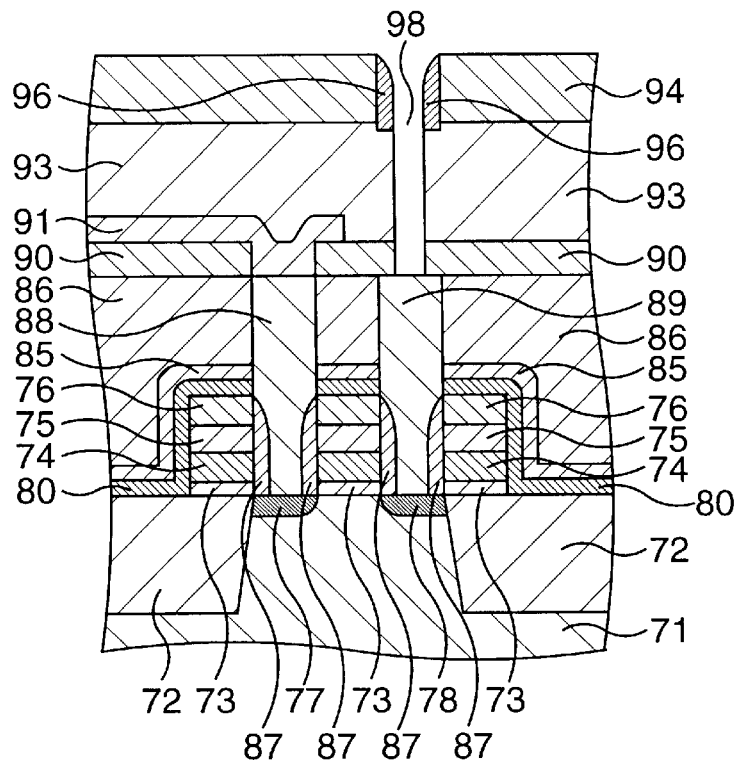
FIGS. 9A and 9B are sectional views showing a manufacturing step for the hybrid system LSI subsequent to that of FIGS. 7A and 7B according to the conventional PSC process.
Figure 9B:
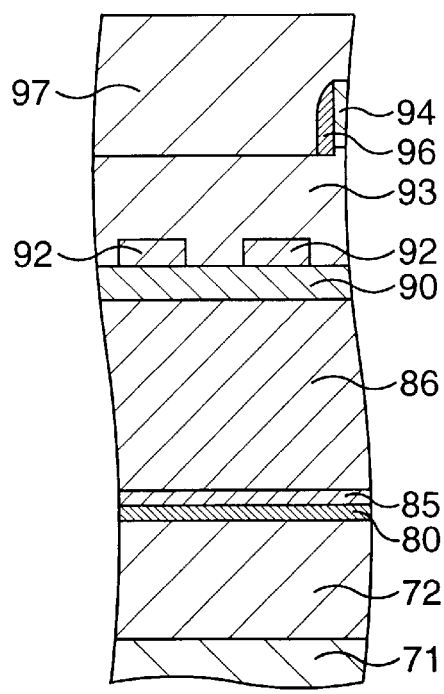
Figure 10A:
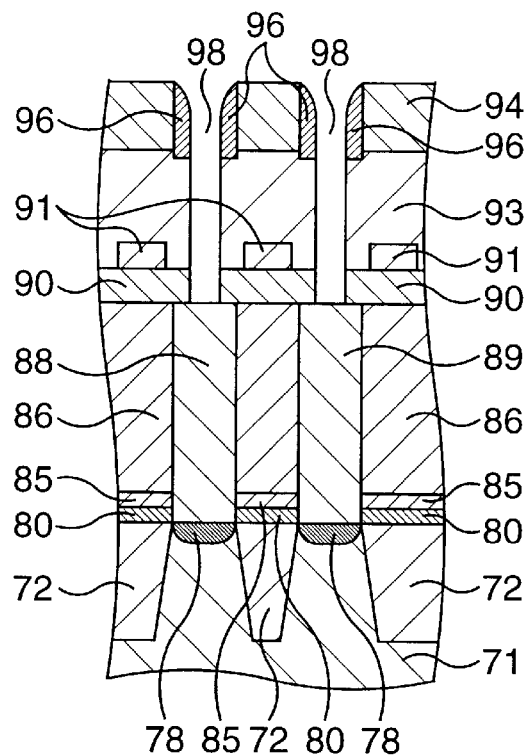
FIGS. 10A and 10B are other sectional views of the hybrid system LSI at the same manufacturing step as that of FIGS. 9A and 9B according to the conventional PSC process.
Figure 10B:
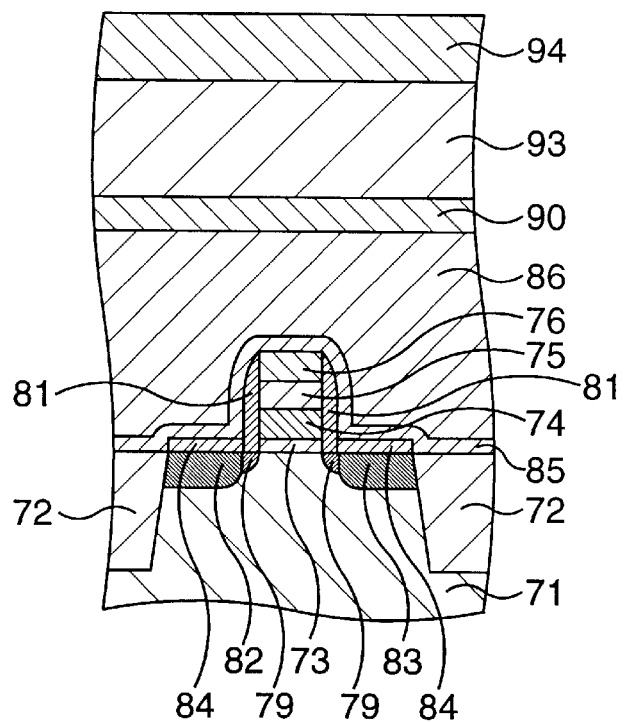
Figure 11A:
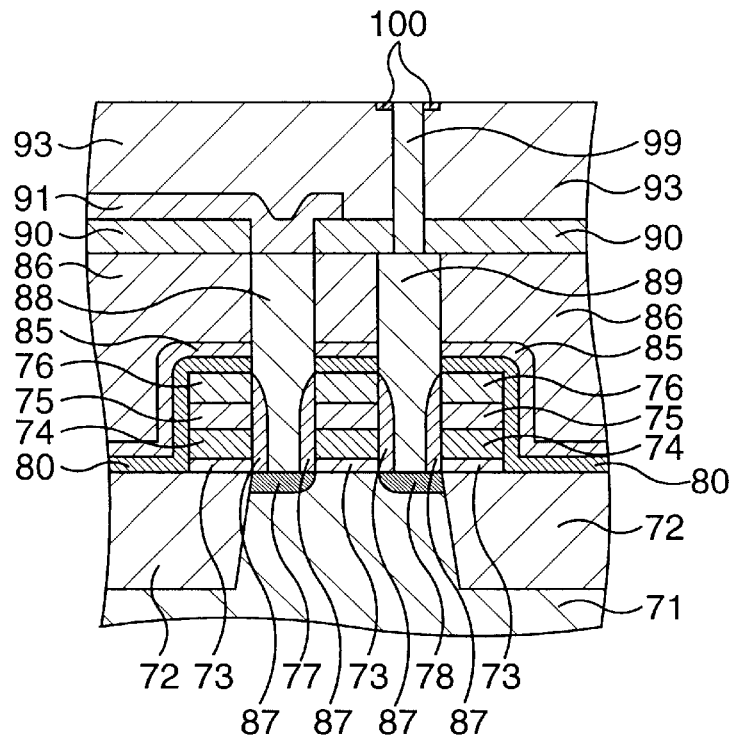
FIGS. 11A and 11B are sectional views showing a manufacturing step for the hybrid system LSI subsequent to that of FIGS. 9A and 9B according to the conventional PSC process.
Figure 11B:
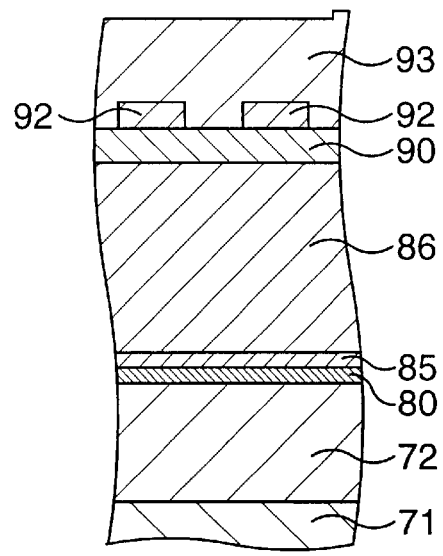
Figure 12A:
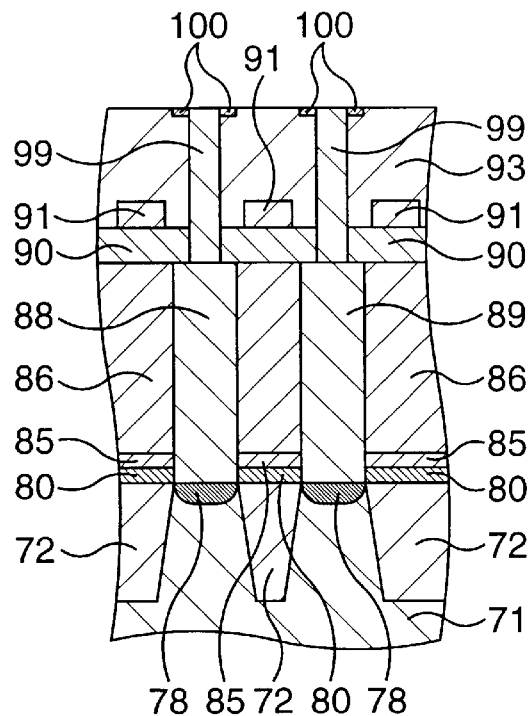
FIGS. 12A and 12B are other sectional views of the hybrid system LSI at the same manufacturing step as that of FIGS. 11A and 11B according to the conventional PSC process.
Figure 12B:
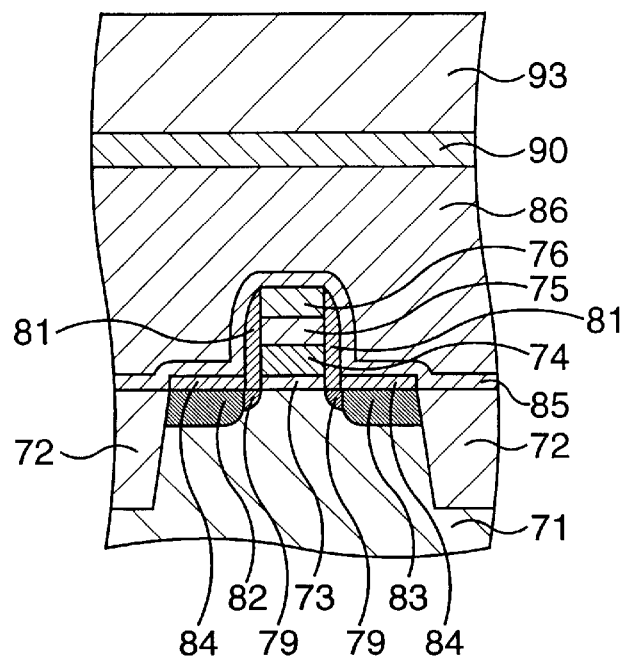
Figure 13A:
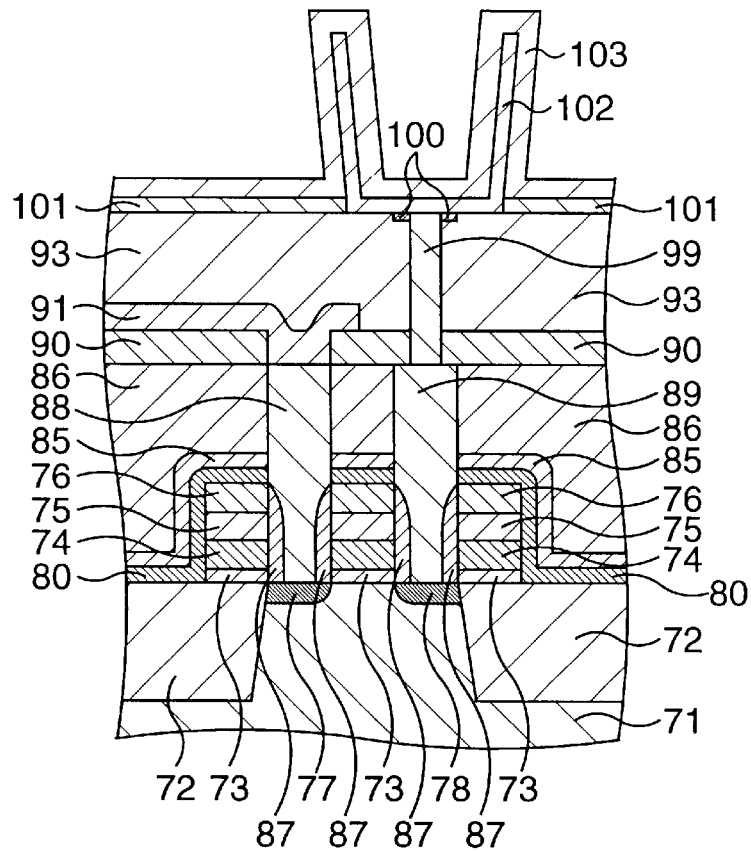
FIGS. 13A and 13B are sectional views showing a manufacturing step for the hybrid system LSI subsequent to that of FIGS. 11A and 11B according to the conventional PSC process.
Figure 13B:
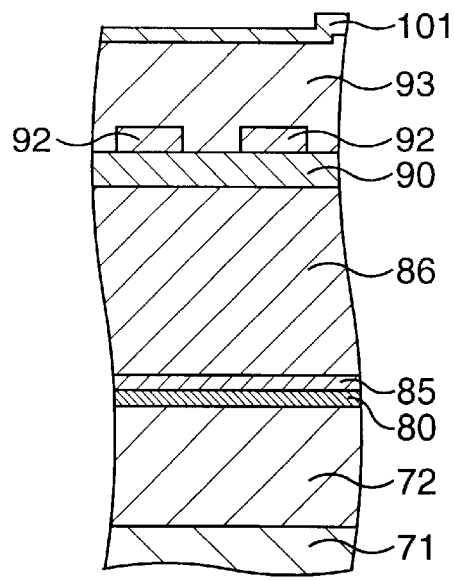
Figure 14A:
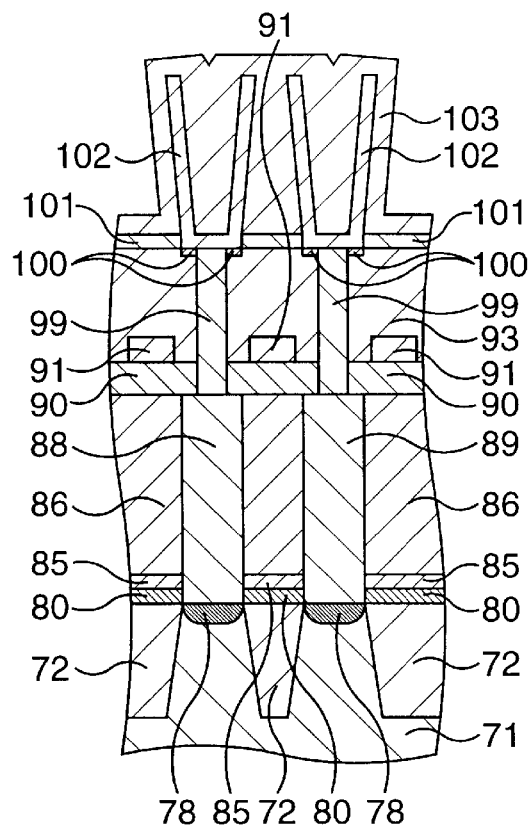
FIGS. 14A and 14B are other sectional views of the hybrid system LSI at the same manufacturing step as that of FIGS. 13A and 13B according to the conventional PSC process.
Figure 14B:
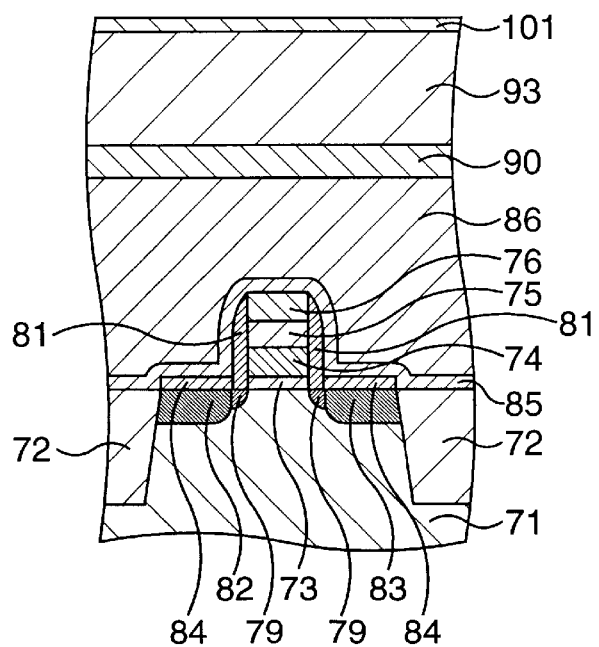
Figure 15:
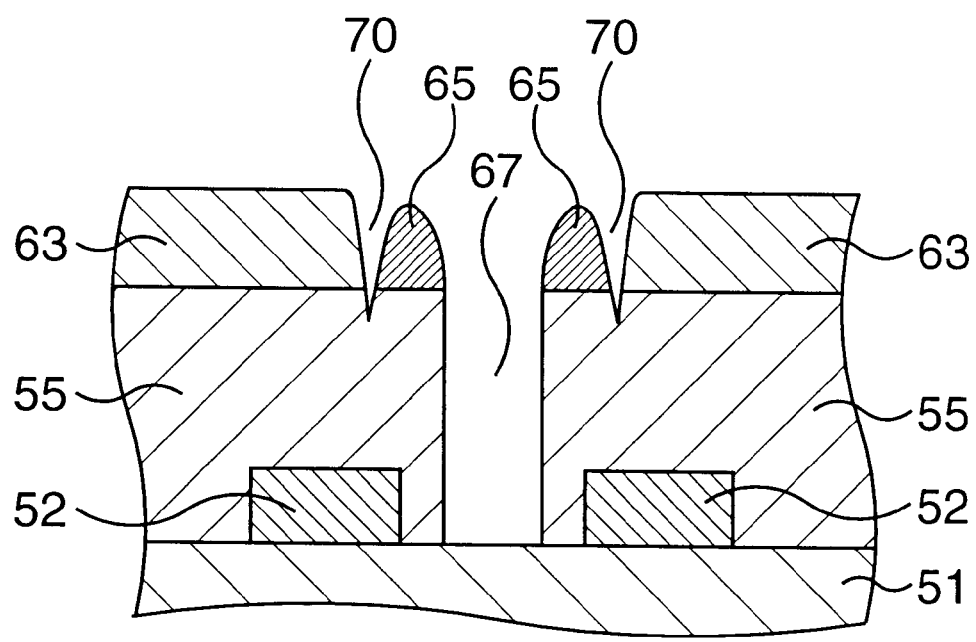
FIG. 15 is a sectional view for explaining a problem in the conventional PSC method.
Figure 16A:
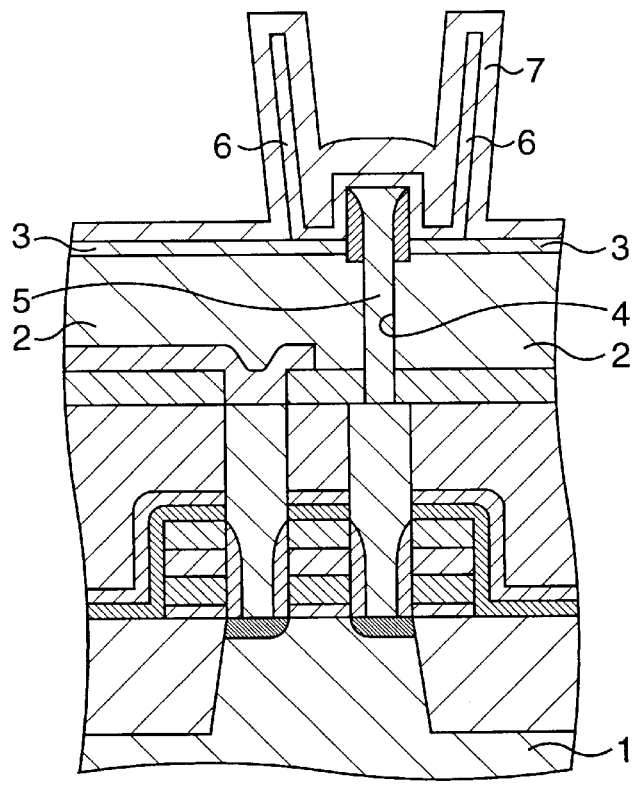
FIGS. 16A and 16B are sectional views showing a typical construction according to the present invention.
Figure 16B:
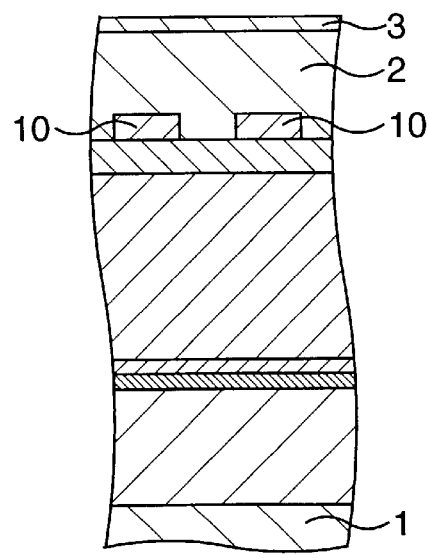

At first, fundamental features of the present invention will be briefly described with reference to FIGS. 16A and 16B.

(1) A semiconductor device according to an aspect of the present invention comprises a first insulating film 2 formed over a semiconductor substrate 1, a second insulating film 3 formed on the first insulating film 2, a contact plug 5 made of a conductive material which vertically penetrates the first and second insulating films 2 and 3 and extends on the second insulating film 3, and a conductive film in contact with the upper surface of the contact plug 5 and part of the second insulating film 3.

In this manner, the contact plug 5 is made of a conductive material which vertically penetrates the first and second insulating films 2 and 3 and extends on the second insulating film 3. With this construction, the conductive film can be brought into close contact with the contact plug 5 in a three-dimensional manner. Besides, a large contact area between them can be obtained. As a result, peeling-off of the conductor film can be successfully prevented.

In this case, the conductor film may be for a bit line or a storage node 6 of DRAM.

(2) A semiconductor device according to another aspect of the present invention comprises a semiconductor substrate including a memory cell region and a peripheral region, an alignment mark 10 for positioning which is made of a conductive material and formed in the peripheral region, a first insulating film 2 which covers the alignment mark 10 and extends to the memory cell region, a second insulating film 3 formed on the first insulating film 2, a contact plug 5 made of a conductive material which vertically penetrates the first and second insulating films 2 and 3 and extends on the second insulating film 3, a storage node 6 in contact with the upper surface of the contact plug 5 and part of the second insulating film 3, and a dielectric film which covers the storage node 6 and is in contact with the second insulating film 3.

In this manner, the contact plug 5 is made of a conductive material which vertically penetrates the first and second insulating films 2 and 3 and extends on the second insulating film 3. With this construction, the conductive film can be brought into close contact with the contact plug 5 in a three-dimensional manner. Besides, a large contact area between them can be obtained. As a result, peeling-off of the conductor film can be successfully prevented.

In this case, a cell plate is so formed as to cover the dielectric film. A capacitor is constructed thus.

(3) According to still another aspect of the present invention, in the above features (1) and (2), the first insulating film 2 is a silicon oxide film, and the second insulating film 3 is a silicon nitride film which grew through a low-pressure chemical vapor deposition process.

In this manner, the first and second insulating films 2 and 3 are made of silicon oxide and silicon nitride which are transparent in relation to visible light. As a result, the process of removing the second insulating film 3 formed on the alignment marks 10 can be eliminated.

(4) According to another aspect of the present invention, a method of manufacturing a semiconductor device, comprises the steps of: forming a first insulating film 2 over a semiconductor substrate 1; forming a second insulating film 3 transparent in relation to visible light, on the first insulating film 2; forming a third film transparent in relation to visible light, on the second insulating film 3; forming an opening portion so as to extend through the third film and the second insulating film 3 up to the first insulating film 2; forming, on the side wall of the opening portion, a spacer having a low etching rate in relation to a first etchant for the first insulating film 2; forming a contact hole 4 so as to extend through the first insulating film 2, using the third film and the spacer as masks; filling the opening portion and the contact hole 4 with a conductive material to form a contact plug 5; and selectively removing the third film using a second etchant whose etching rate to the second insulating film 3 is low.

In this manner, the second insulating film 3 and the third film are made of materials transparent in relation to visible light. As a result, when patterning the second insulating film 3 and the third film, the etching process for exposing alignment marks can be eliminated. Besides, the formation process of a resist mask upon formation of the contact hole 4 can also be eliminated. Thus the number of manufacturing steps can be reduced.

(5) According to still another aspect of the present invention, in the above feature (4), the first insulating film is a silicon oxide film, the second insulating film is a silicon nitride film which grew through a low-pressure chemical vapor deposition process, and the third film is a silicon nitride film which grew through a plasma chemical vapor deposition process.

In this manner, as a combination of the second insulating film 2 and the third film either of which is transparent in relation to visible light, and one of which can have an etching selectivity to the other, oil suitable is a combination of a silicon nitride film which grew through a low-pressure chemical vapor deposition process capable of growth at a low temperature, i.e., an LP-SiN film, and a silicon nitride film which grew through a plasma chemical vapor deposition process, i.e., a P-SiN film.

Taking the above-described features of the present invention into consideration, an embodiment of the present invention will be described with reference to FIGS. 17 to 26B.

FIGS. 17, 19, 21, 23 and 25 are sectional views of a memory cell portion. FIGS. 18A, 20A, 22A, 24A and 26A are sectional views perpendicular to those of FIGS. 17, 19, 21, 23 and 25, respectively. FIGS. 18B, 20B, 22B, 24B and 26B are sectional views of a logic transistor portion. FIG. 18C is a sectional view of an alignment mark portion.

Figure 17:
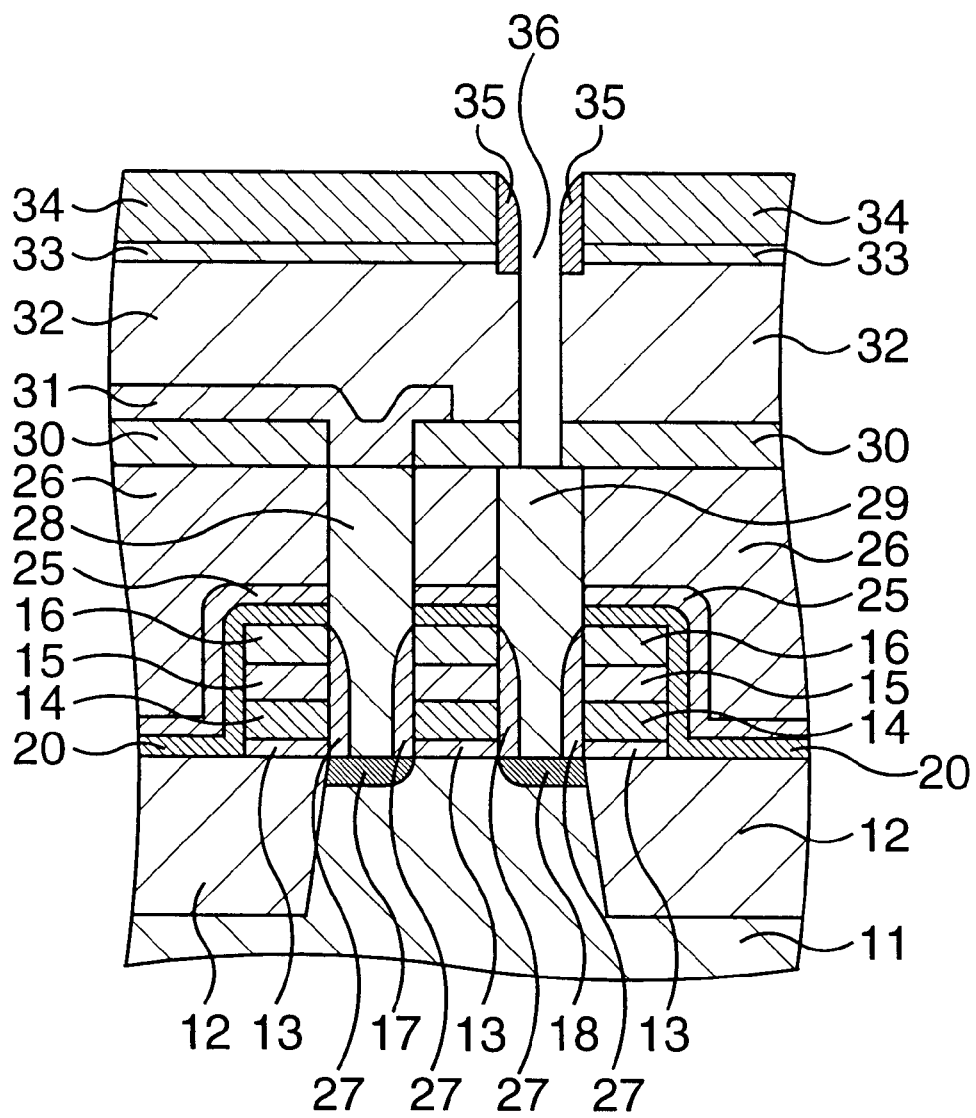
FIG. 17 is a sectional view showing a manufacturing step according to an embodiment of the present invention.
Figure 18A:
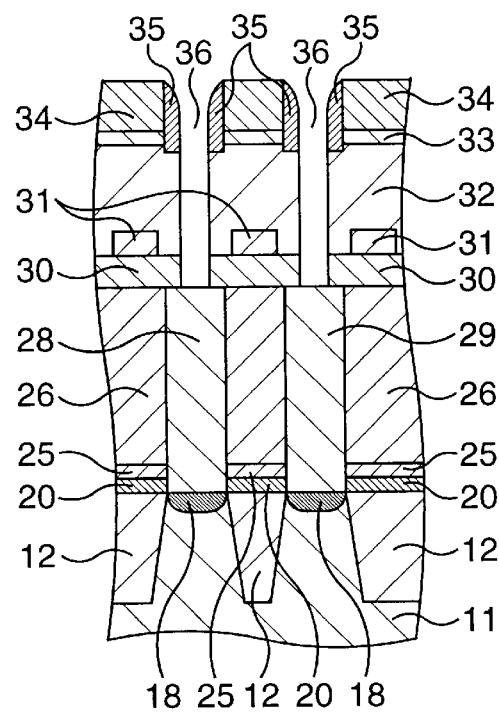
FIGS. 18A to 18C are other sectional views at the same manufacturing step of that of FIG. 17.
Figure 18B:
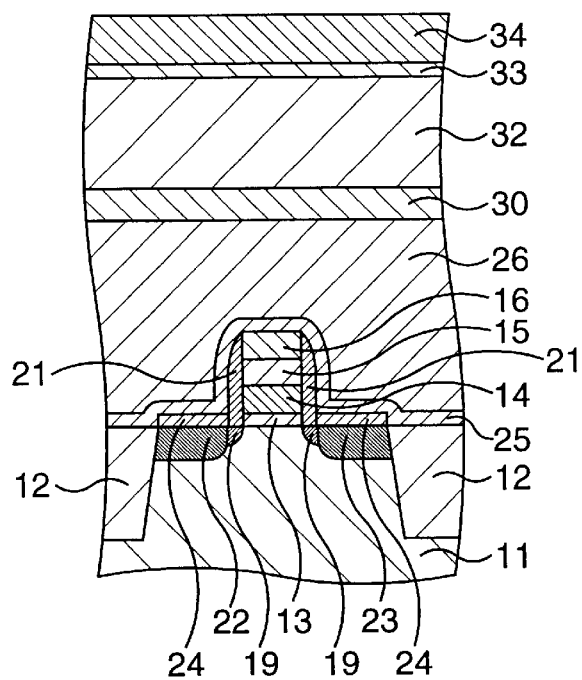
Figure 18C:
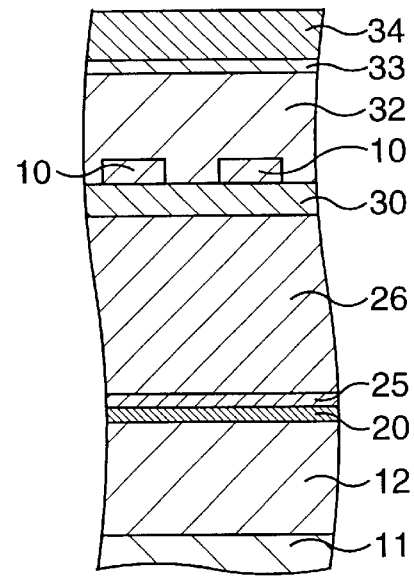

Referring first to FIGS. 17 to 18B, electrically insulating regions 12 for element isolation are formed in a p-type silicon substrate 11 through an STI (Shallow Trench Isolation) process, like the conventional method.

The p-type silicon substrate 11 may be substituted by a p-type well formed in an n- or p-type silicon substrate. Besides, channel stop regions or doped channel regions may be formed therein through an ion implantation process, at need.

Next, a gate oxide film 13 is formed by thermal oxidation using wet $O_2$ gas. An amorphous Si film is then formed by deposition into a thickness of, e.g., 100 nm. The amorphous Si film is doped with As or P by ion implantation. A conductive Si gate electrode layer 14 is obtained thereby.

Next, a 100 nm-thick $WSi_2$ film 15 is formed by deposition, for example. Subsequently, a 100 nm-thick P-SiN film 16 is formed through a plasma CVD process, for example. After this, in the DRAM portion, patterning by etching are carried out using a photolithographic technique, according to a design rule of, e.g., 0.20 $\mu$m/0.20 $\mu$m for line/space, to form gate electrodes and word lines successive from the gate electrodes.

The length of the gate electrode in the logic transistor portion of FIG. 18B is, e.g., 0.18 $\mu$m.

Next, for n-channel FET portions, ion implantation with P is carried out. In the DRAM portion, n-type drain and source regions 17 and 18 are formed thereby. At the same time, in the logic transistor portion, n-type LDD regions 19 are formed.

Next, a SiN film 20 of a thickness of, e.g., 60 nm, is formed on the entire surface through a CVD process. After this, while masking the DRAM portion with a resist, anisotropic etching is carried out to form a spacer 21 on either side wall of the gate electrode in the logic transistor portion. Ion implantation with As is then carried out using the spacers 21 as masks, to form n$^+$type drain and source regions 22 and 23. After this, defects attendant upon ion implantation are repaired through an RTA (Rapid Thermal Anneal) process, e.g., heat treatment at 1000° C. for 10 seconds.

Next, a Co film is formed on the entire surface by deposition, into a thickness of, e.g., 50 nm. Heat treatment at 500° C. for 30 seconds is then carried out to form silicide electrodes 24 of $CoSi_2$ only on the surfaces of the n$^+$-type drain and source regions 22 and 23. Subsequently, etching is carried out with a mixture solution of hydrogen peroxide and ammonia or a mixture solution of sulfuric acid and hydrogen peroxide to remove unreacted Co.

Next, a SiN film 25 of a thickness of, e.g., 20 nm, is formed on the entire surface through a CVD process.

In this case, by forming the SiN film 25 in a growth device with a load lock system, oxidation of the silicide electrodes 24 by oxygen engulfed during the growth of the SiN film 25 can be successfully prevented.

Next, a BPSG film 26 is formed on the entire surface by deposition. In the DRAM portion, bit and storage contacts are then formed through an SAC process.

In this case, after a resist pattern (not shown) for 0.24 $\mu$m-wide via-holes is formed using a photolithographic technique, the BPSG film 26 is etched by double-channel RIE using $C_4F_8CO+Ar+O_2$ gas. Subsequently, the SiN film 25 is etched to expose the n-type drain and source regions 17 and 18.

In this etching process, sidewalls 27 are formed on the opposed side surfaces of the gate electrodes. These sidewalls 27 prevent short circuits between the gate electrodes and Si plugs 28 and 29 which will be described later.

As the capacitance on each gate electrode, i.e., word line, the capacitance between it and the p-type silicon substrate 11 across the gate oxide film 13 is dominant. Therefore, an increase in capacitance due to use of SAC method matters little.

Next, a thick amorphous Si layer doped with, e.g., P, is formed by deposition. Polishing is then carried out until the surface of the BPSG film 26 is exposed. The part of the doped amorphous Si layer formed on the BPSG film 26 is thereby removed to form Si plugs 28 and 29 filling in via-holes.

Next, a $P-SiO_2$ film 30 of a thickness of, e.g., 100 nm, is formed on the entire surface through a plasma CVD process. A via-hole is then formed for the Si plug 28 which is to serve as a bit contact. After this, a Ti film of a thickness of, e.g., 20 nm, a TiN film of a thickness of, e.g., 50 nm, and a W film of a thickness of, e.g., 100 nm, are formed in order on the entire surface by deposition. These films are then patterned into a predetermined shape.

Through this patterning process, bit lines 31 of the Ti/TiN/W structure are formed. At this time, in the alignment mark portion, alignment marks 10 of the Ti/TiN/W structure are formed, as shown in FIG. 18C.

The bit lines 31 are formed according to a design rule of 0.16 $\mu$m/0.24 $\mu$m for line/space, for example.

Next, a $SiO_2$ film 32 of a thickness of, e.g., 700 nm, is formed through an HDP-CVD process. Subsequently, the $SiO_2$ film 32 is polished by about 200 nm through a CMP process to flatten the surface of the $SiO_2$ film 32.

Next, through a thermal reaction of $SiH_4Cl_2$, $NH_3$, and $N_2$ at 700° C. and 26.6 Pa (0.2 Torr) as growth pressure in an LPCVD process, an LP-SiN film 33 of a thickness of, e.g., 50 nm is formed on the entire surface by deposition. Subsequently, by a 2-channel plasma CVD method using $SiH_4$ gas, $NH_3$ gas, and $N_2$ gas, a P-SiN film 34 of a thickness of, e.g., 250 nm is formed by deposition at 400° C. and 26.6 Pa (0.2 Torr) as growth pressure while applying power of 500 W at 13.56 MHz and 500 W at 400 KHz.

Next, a resist pattern (not shown) for via-holes of a width of 0.24 $\mu$m (=240 nm) is formed using a photolithographic technique. After this, anisotropic etching by RIE using fluorocarbon-base type gas is carried out for the P-SiN film 34 and the LP-SiN film 33, in order. An opening portion is thereby formed at the position corresponding to the Si plug 29 which is to serve as a storage contact.

In this case, although the $SiO_2$ film 32 has little etching selectivity to the P-SiN film 34 and the LP-SiN film 33, the $SiO_2$ film 32 may be etched a little.

Besides, since both the P-SiN film 34 and the LP-SiN film 33 are transparent in relation to visible light, the alignment marks 10 can be detected through them. Thus, the process of removing the P-SiN film 34 and the LP-SiN film 33 over the alignment marks 10 is unnecessary.

Next, an amorphous silicon layer of a thickness of, e.g., 95 nm, doped with P, is formed on the entire surface by deposition. Subsequently, anisotropic etching is carried out to form Si spacers 35 whose maximum width is 95 nm. After this, anisotropic etching by double-channel RIE using $C_4F_8$+ $CO+Ar+O_2$ gas, is carried out using the Si spacers 35 and the P-SiN film 34 as masks, to form a via-hole 36 whose minimum width is 0.05 $\mu$m (=50 nm=240 nm−2×95 nm).

In this case, since the P-SiN film 34 exists over the portion of the alignment marks 10, the alignment marks 10 need not be covered with a resist.

The minimum width 0.05 $\mu$m is derived by subtracting (the anti-breakdown assurance film thickness of the $SiO_2$ film 32 as an insulating interlayer)×2=0.06 $\mu$m, (the photo-lithographic alignment)×2=0.12 $\mu$m, and (an increase in width of the Si spacers due to oxidation film by pre-process)=0.01 $\mu$m from the width 0.24 $\mu$m of the opening portion. Conversely, the width of the opening portion must be so determined as to obtain the minimum width 0.05 $\mu$m.

Figure 19:
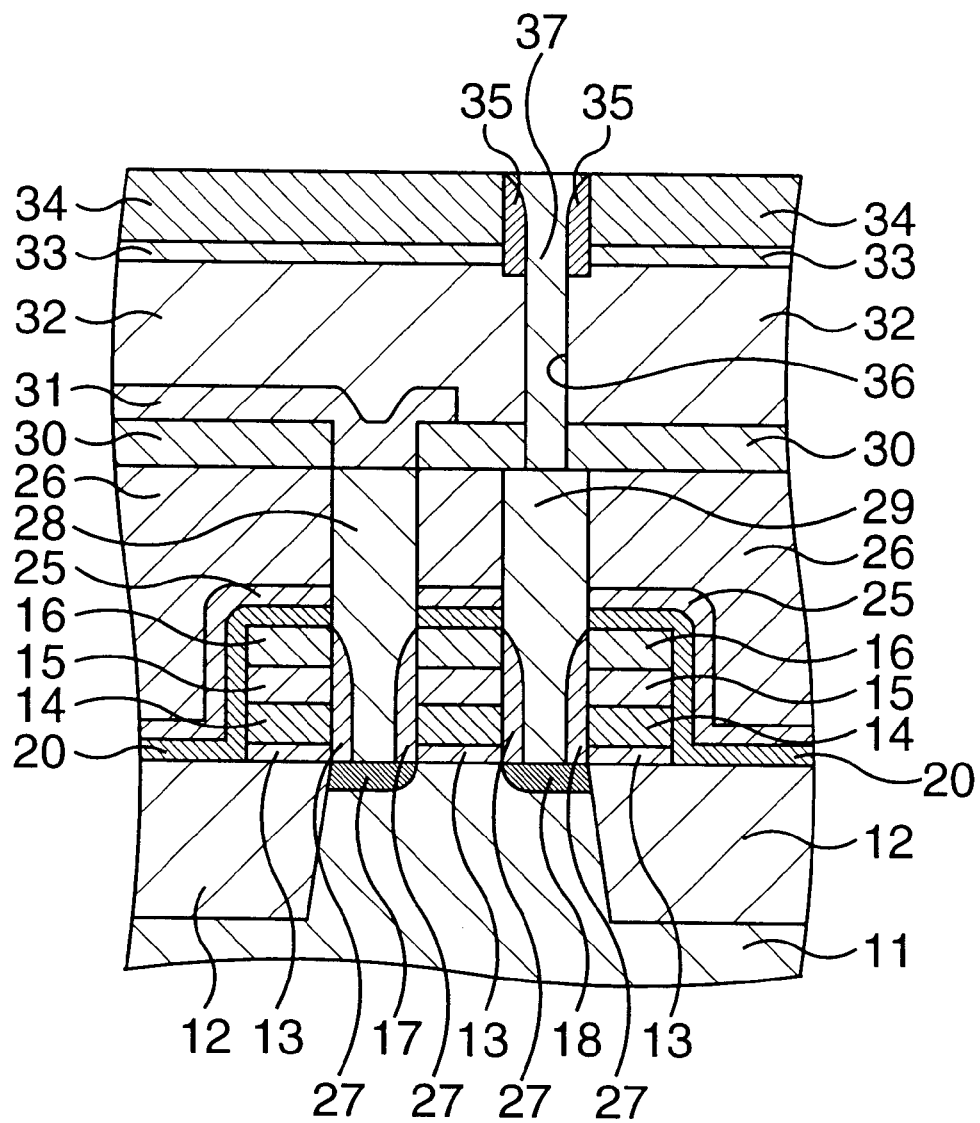
FIG. 19 is a sectional view showing a manufacturing step subsequent to that of FIG. 17 according to the embodiment of the present invention.
Figure 20A:
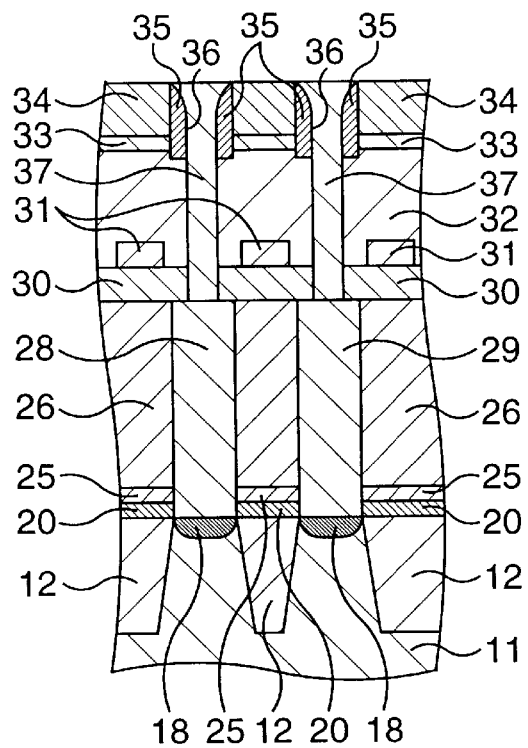
FIGS. 20A and 20B are other sectional views at the same manufacturing step of that of FIG. 19.
Figure 20B:
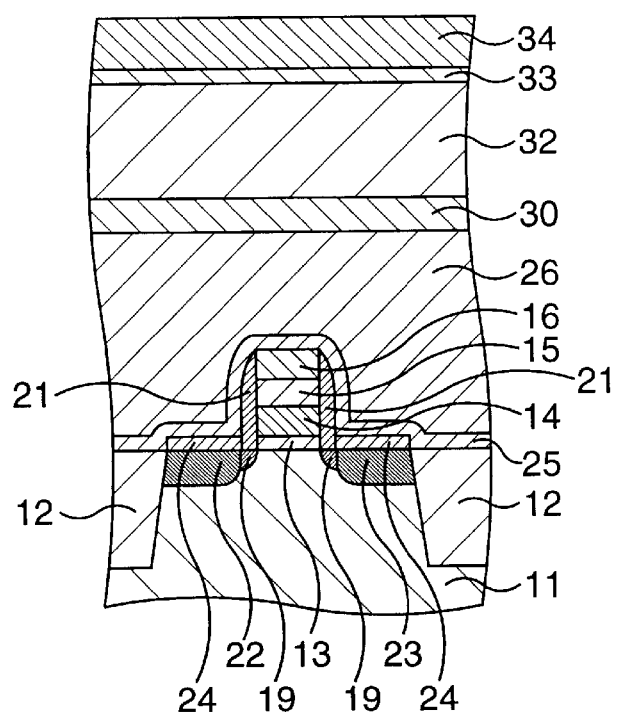

Referring next to FIGS. 19 to 20B, an amorphous Si layer of a thickness of, e.g., 200 nm, doped with, e.g., P, is formed on the entire surface by deposition. Polishing by CMP method is then carried out until the surface of the P-SiN film 34 is exposed. The part of the doped amorphous Si layer formed on the P-SiN film 34 is thereby removed to form a Si plug 37 filling in the via-hole 36.

In this case, since the temperature for forming the doped amorphous Si layer is, e.g., 500° C., the stress on the P-SiN film 34 never changes from compression to tensile.

Figure 21:
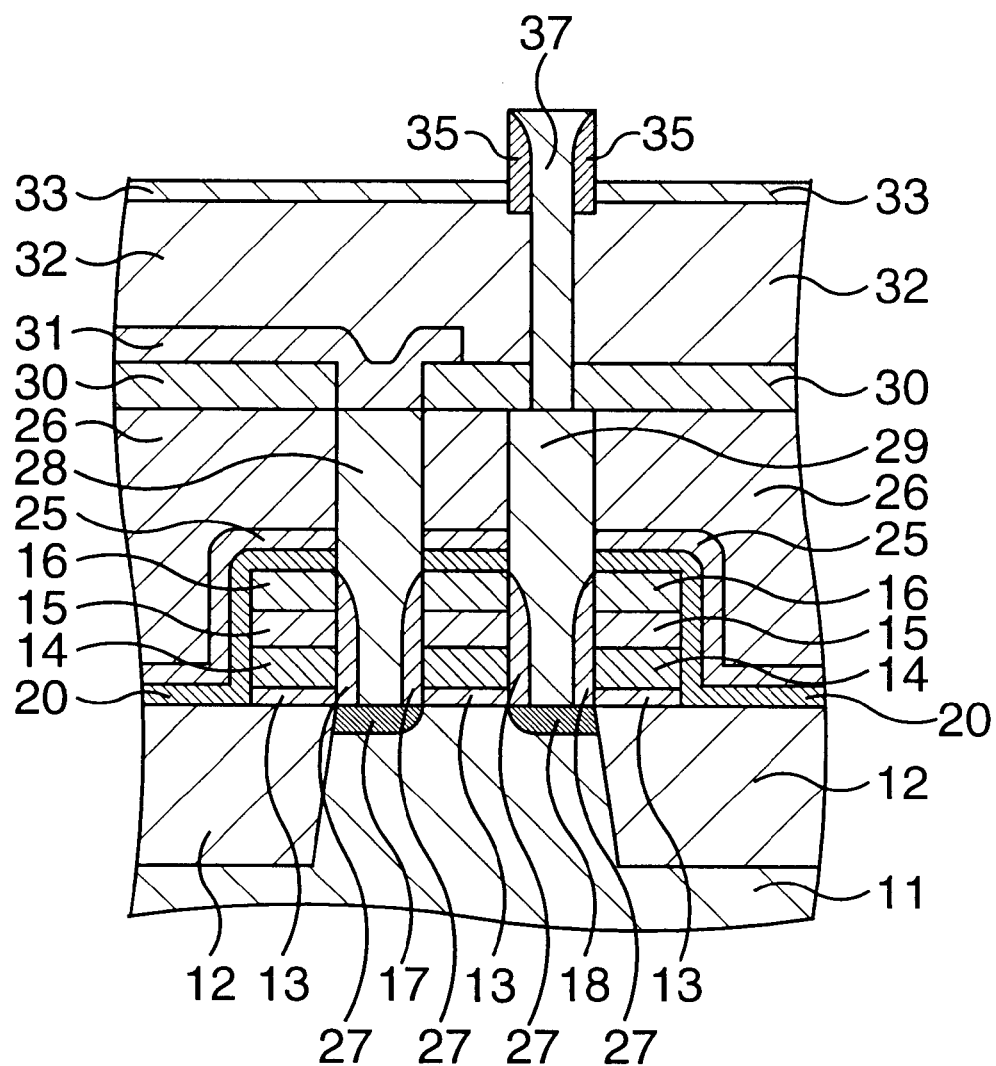
FIG. 21 is a sectional view showing a manufacturing step subsequent to that of FIG. 19 according to the embodiment of the present invention.
Figure 22A:
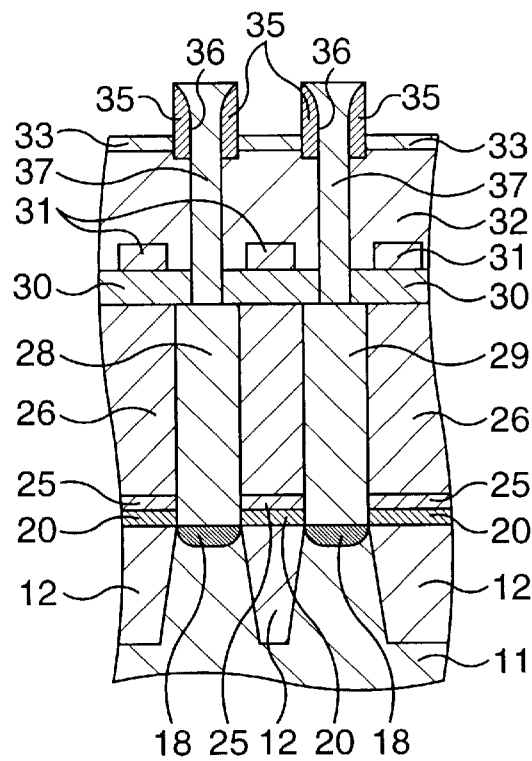
FIGS. 22A and 22B are other sectional views at the same manufacturing step of that of FIG. 21.
Figure 22B:
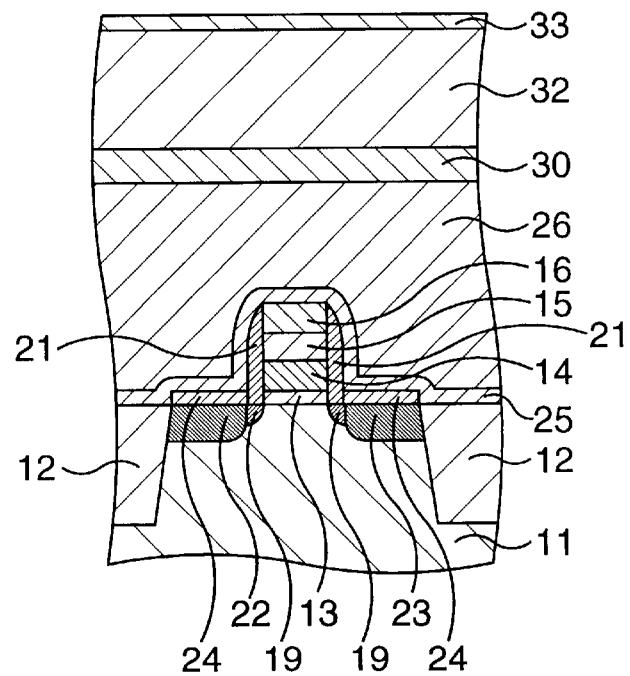

Referring next to FIGS. 21 to 22B, the P-SiN film 34 is selectively removed with an HF aqueous solution so that the Si plug 37 protrudes.

Figure 27:
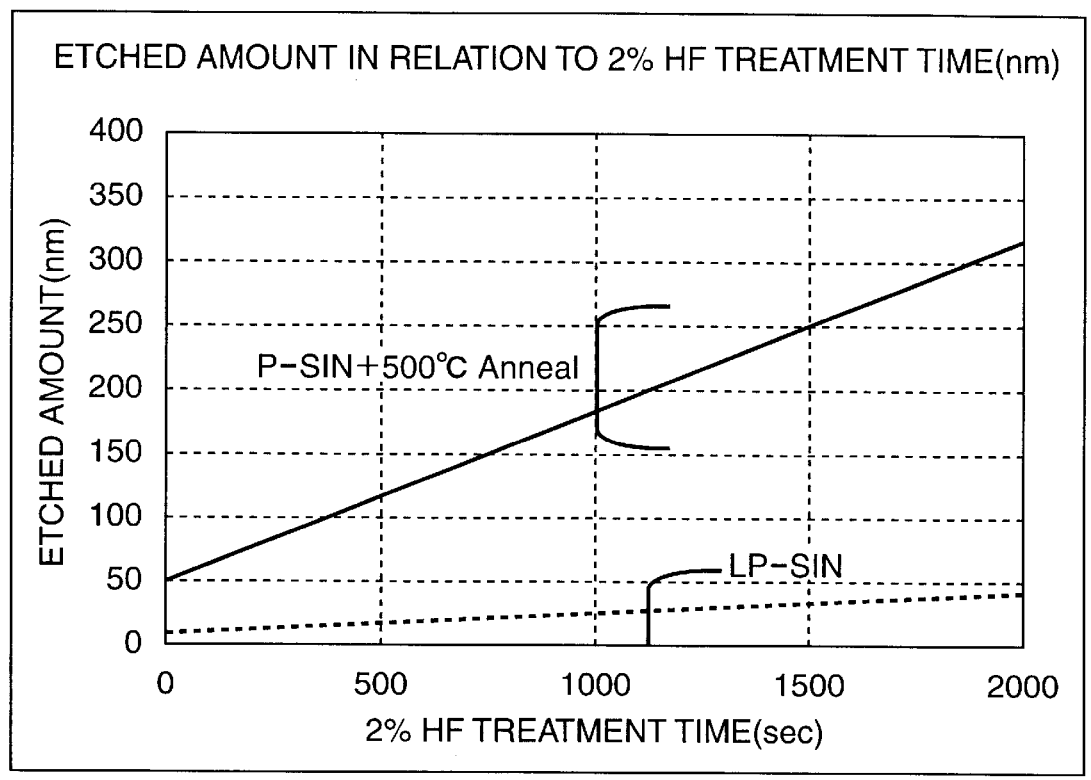
FIG. 27 is a graph showing the relation in etched amount between P-SiN and LP-SiN in relation to 2% HF.

In relation to this etching process, FIG. 27 shows a relation between HF treatment time and etched amount of a P-SIN film which has been subjected to a heat treatment corresponding to the growth of a doped amorphous Si layer, and the LP-SIN film 33.

In FIG. 27, the axis of abscissas represents HF treatment time, and the axis of ordinates represents etched amount. The etched amount of the P-SiN film is ensured which is about eight times that of the LP-SiN film. For removing 250 nm of the P-SiN film 34, treatment for 1500 seconds suffices. Even if the LP-SiN film 33 is treated with HF aqueous solution for 1500 seconds, if the thickness of the LP-SiN film 33 is about 32 nm or more, then the LP-SiN film 33 remains partially and it can be used as an etching stopper. Thus, if the thickness of the P-SiN film 34 is set to be eight times or less that of the LP-SiN film 33, variation of etching time due to loss in thickness of the P-SiN film 34 in the CMP process attendant upon formation process of the via-hole 36 or Si plug, may not be taken into consideration.

Figure 23:
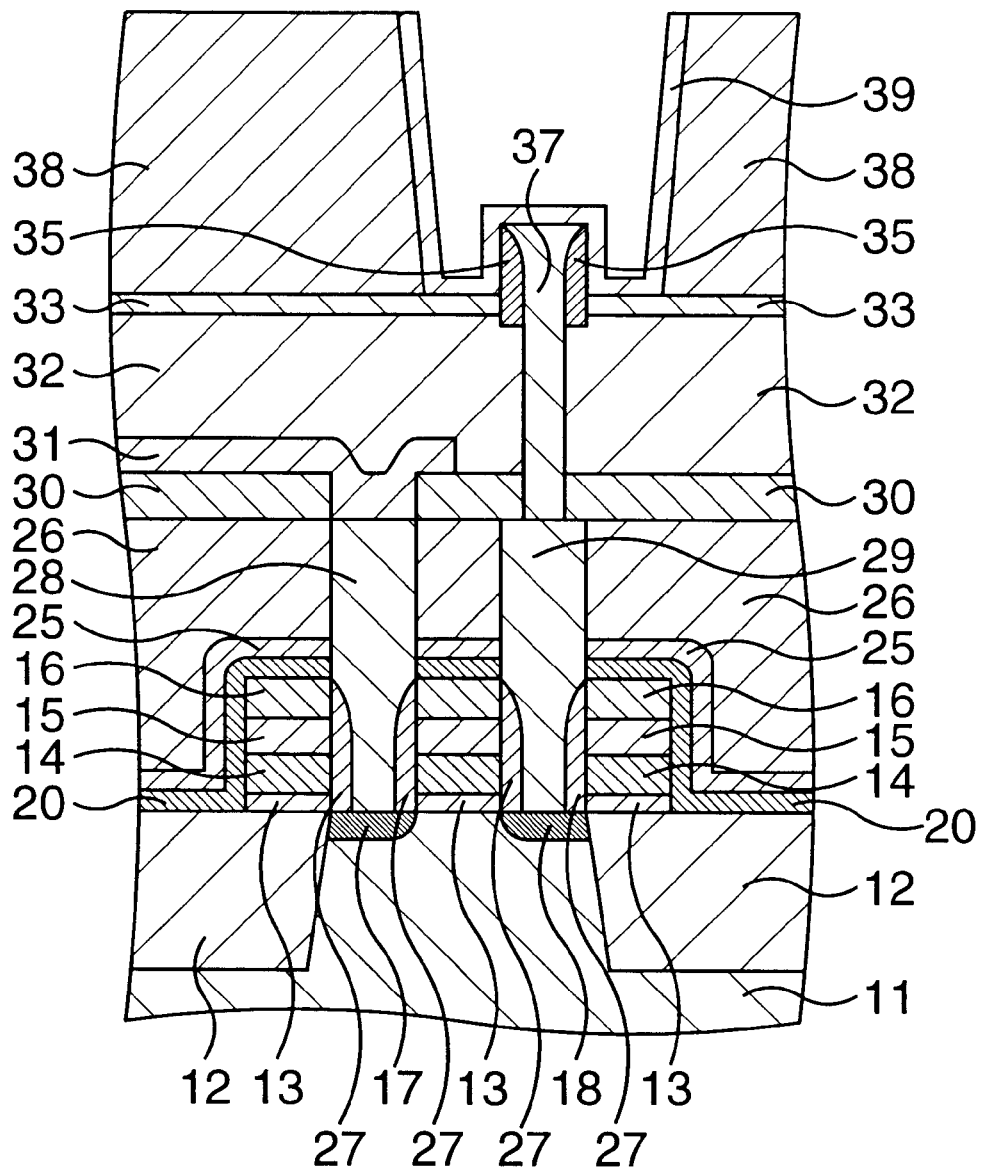
FIG. 23 is a sectional view showing a manufacturing step subsequent to that of FIG. 21 according to the embodiment of the present invention.
Figure 24A:
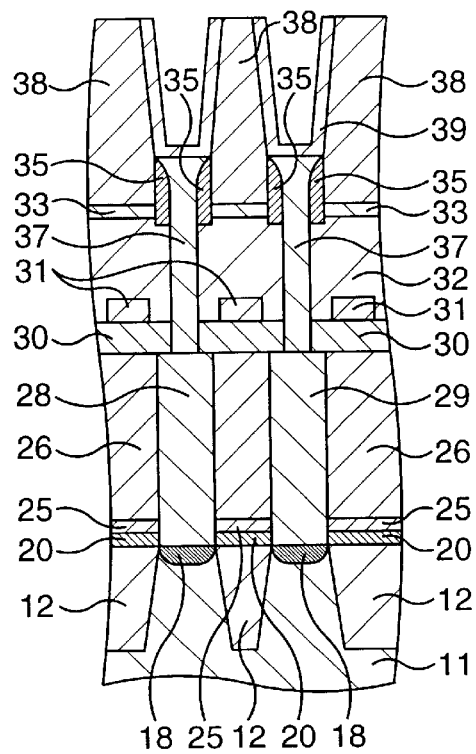
FIGS. 24A and 24B are other sectional views at the same manufacturing step of that of FIG. 23.
Figure 24B:
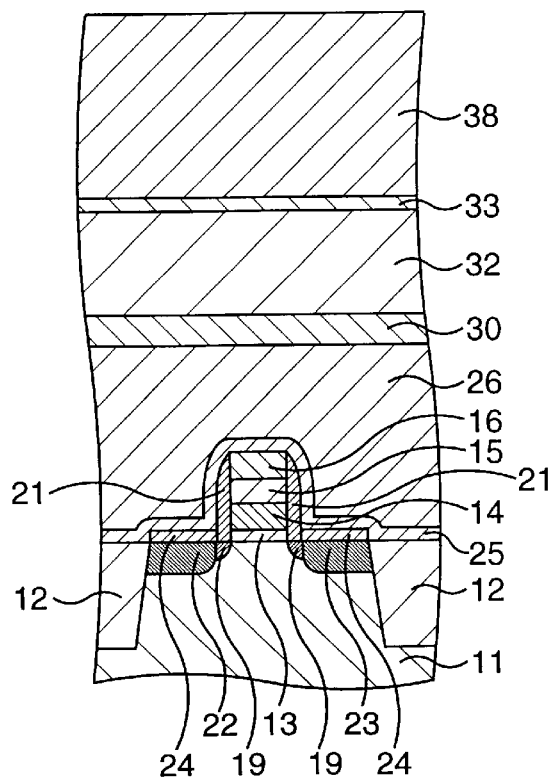

Referring next to FIGS. 23 to 24B, a BPSG film 38 of a thickness of, e.g., 1 $\mu$m, is formed on the entire surface by deposition. The BPSG film 38 is then etched until the LP-SiN film 33 is exposed, so that a wide opening portion is formed which reaches the Si plug 37 formed by PSC method. After this, an amorphous Si layer of a thickness of, e.g., 50 nm, doped with P, is formed on the entire surface by deposition. Subsequently, the part of the doped amorphous Si layer formed on the BPSG film 38 is removed through a CMP process to form a storage node 39 having cylindrical outer and inner surfaces.

In the illustrated example, etching is carried out until the LP-SiN film 33 is exposed. But, there is no problem even if etching is carried out until the LP-SIN film 33 is penetrated and the $SiO_2$ film 32 is exposed.

Figure 25:
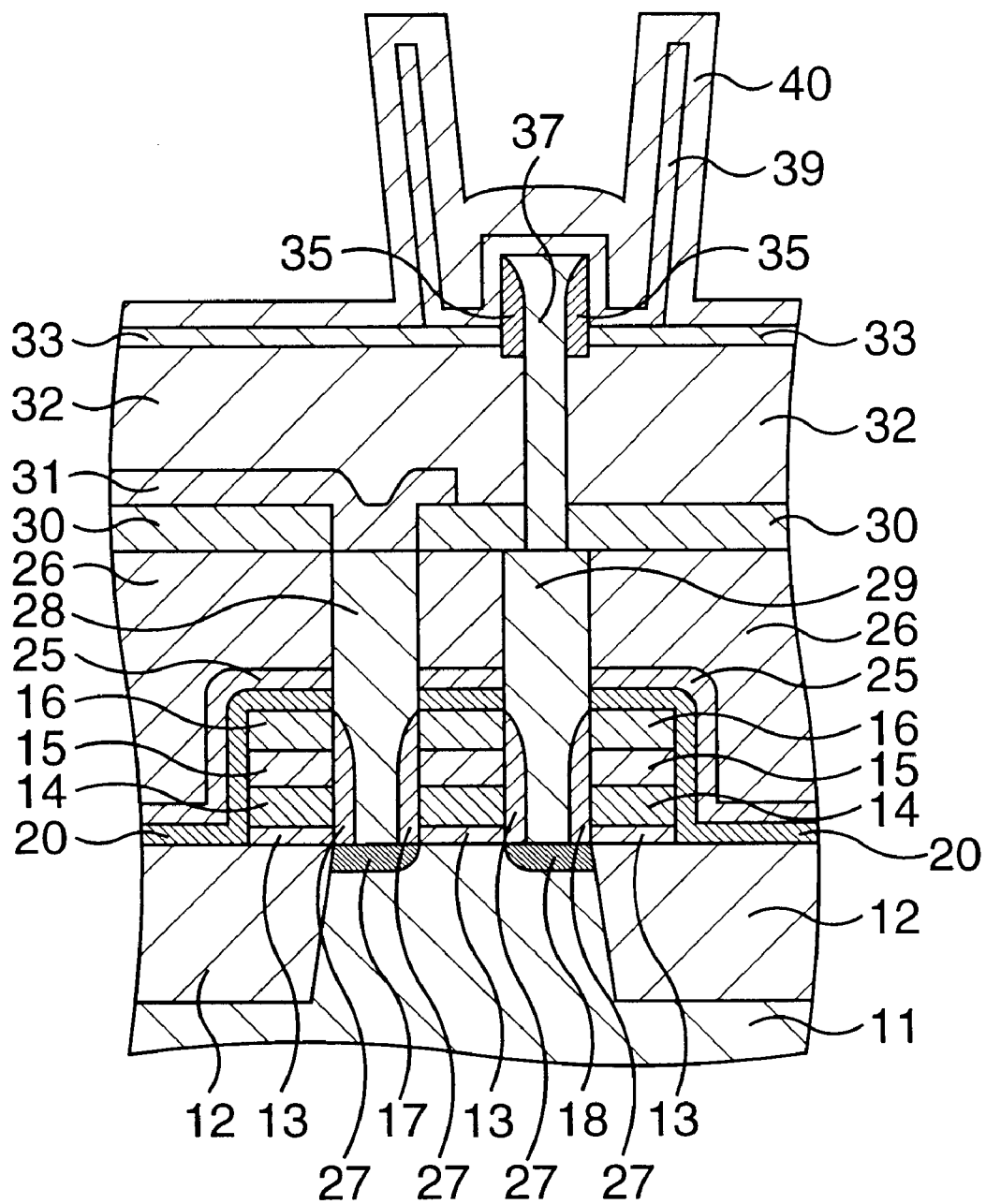
FIG. 25 is a sectional view showing a manufacturing step subsequent to that of FIG. 23 according to the embodiment of the present invention.
Figure 26A:
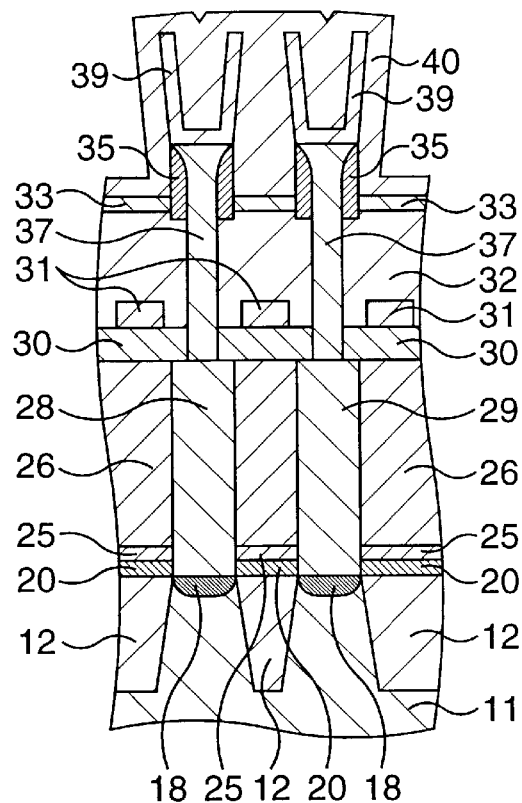
FIGS. 26A and 26B are other sectional views at the same manufacturing step of that of FIG. 25.
Figure 26B:
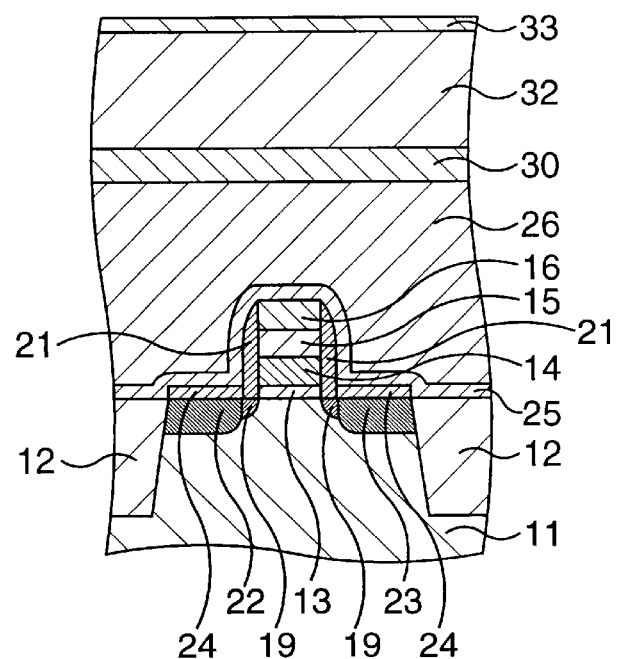

Referring next to FIGS. 25 to 26B, the BPSG film 38 is selectively removed with an HF aqueous solution using the LP-SiN film 33 as an etching stopper. Subsequently, a SiN film (not shown) of a thickness of, e.g., 5 nm, is formed on the surface of the storage node 39 through an LPCVD process at, e.g., 700° C. The SiN film is to serve as a dielectric layer of a capacitor. After this, an amorphous Si film of a thickness of, e.g., 100 nm, doped with P, is formed on the entire surface by deposition to form a cell plate 40 common for storage nodes 39.

In the subsequent process not illustrated, an insulating interlayer is formed on the entire surface. Heat treatment by RTA method at 900° C. for 10 seconds is carried out for re-activation to ensure a certain current of each MOSFET. After this, wiring process and so on are performed. A system. LSI in which a DRAM is incorporated is obtained thereby.

In the above RTA process, since the P-SiN film 34 has been removed, peeling or cracking thereof need not be taken into consideration.

As described above, according to the embodiment of the present invention, upon formation of the minute via-hole by PSC method, the hard mask is made of a P-SiN film transparent in relation to visible light. Therefore, the process of removing the hard mask formed over the alignment marks, is unnecessary. Besides, in the formation process of the via-hole, the upper portion of each alignment mark need not be protected with a resist. Thus the number of manufacturing steps can be reduced.

That is, the number of manufacturing steps can be reduced by three steps in total, i.e., two steps of photolithographic and etching processes for removing the hard mask, and one step of forming a protective resist film.

Besides, when the P-SiN film 34 is processed, selective etching becomes possible because of provision of the thin LP-SiN film 33 which serves as an etching stopper. In addition, occurrence of peeling-off and cracking may not be taken into consideration in heat treatment at a high temperature because the thick P-SiN film 34 has been removed in advance.

Besides, since PSC method is employed for forming the via-hole 36, no nitride film exists between the bit line 31 and the Si plug 37, unlike SAC or MDC method. This can suppress an increase in capacitance of interconnection lines.

Besides, since the Si plug 37 is formed in a protruding state, the Si plug 37 can be brought into close contact with the storage node 39 in a three-dimensional manner, and the contact area between them is large. Therefore, in the process of removing the BPSG film 38, the storage note 39 is never lost due to peeling-off or the like.

Hereinbefore, a preferred embodiment of the present invention has been described. But, the present invention is never limited to the construction and conditions of the embodiment, and various changes and modifications can be made therein.

For example, in the embodiment of the present invention, the source and drain electrodes in the logic transistor portion are made of $CoSi_2$. But, the material of the electrodes is not limited to $CoSi_2$. Also usable is $TiSi_2$ with using Ti in place of Co.

Besides, in the above embodiment, the electrically insulating regions for element isolation are formed by STI (Shallow Trench Isolation) method. But, the formation method of the element isolation structure is not limited to STI method. Also usable is LOCOS (Local Oxidation of Silicon) method or the like.

Besides, in the above embodiment, the storage node is formed into a relatively simple shape. But, the surface of the storage node can be roughened to increase its surface area. This increases the storage capacity.

Besides, in the above embodiment, PSC method is used for forming the storage node contact. But, it may be used also for forming opening portions for connecting bit lines through bit contacts.

Besides, the values of the design rules for line/space described in the above embodiment, is only by way of example. Various proper values can be used for them as occasion demands.

Besides, in the above embodiment, a hybrid system LSI including a DRAM has been described. But, the present invention is not limited to such a hybrid system LSI with a DRAM. The present invention is applicable also to an ordinary DRAM itself. Further, the present invention is applicable also to a case where formation of minute via-holes is necessary and an increase in parasitic capacity on interconnection lines must be suppressed, in a SRAM, Fe-RAM, or the like, other than DRAM.

Besides, in the above embodiment, upon formation of the storage node, a BPSG film is used. But, the material for this purpose is not limited to BPSG. Any material can be used if it can have a high etching rate in relation to a predetermined etchant. Further, the material can not be an insulator.

What is claimed is:

1. A method of manufacturing a semiconductor device, comprising the steps of:

forming a first insulating film above a semiconductor substrate;

forming a second insulating film directly on said first insulating film;

forming a third insulating film directly on said second insulating film, said third insulating film having a low etching rate in relation to a first etchant for said first insulating film;

forming an opening portion so as to extend through said third and second insulating films up to said first insulating film;

forming a spacer on the side wall of said opening portion, said spacer having a low etching rate in relation to said first etchant for said first insulating film;

forming a contact hole so as to extend through said first insulating film, using said third insulating film and said spacer as masks;

filling said opening portion and said contact hole with a first conductive material to form a contact plug; and selectively removing said third insulating film using a second etchant whose etching rate to said second insulating film is low.

2. A method according to claim 1, wherein said first, second, and third insulating films are transparent in relation to visible light.

3. A method according to claim 2, wherein said first insulating film is a silicon oxide film, said second insulating film is a silicon nitride film which grew through a low-pressure chemical vapor deposition process, and said third insulating film is a silicon nitride film which grew through a plasma chemical vapor deposition process.

4. A method according to claim 3, wherein said silicon nitride film which grew through said plasma chemical vapor deposition process, is removed with an aqueous solution of hydrofluoric acid, using, as an etching stopper, said silicon nitride film which grew through said low-pressure chemical vapor deposition process.

5. A method according to claim 3, wherein the thickness of said silicon nitride film which grew through said plasma chemical vapor deposition process, is eight times or less that of said silicon nitride film which grew through said low-pressure chemical vapor deposition process.

6. A method of manufacturing a semiconductor device, comprising the steps of:

forming a first insulating film above a semiconductor substrate;

forming a second insulating film on said first insulating film;

forming a third insulating film on said second insulating film, said third insulating film having a low etching rate in relation to a first etchant for said first insulating film;

forming an opening portion so as to extend through said third and second insulating films up to said first insulating film;

forming a spacer on the side wall of said opening portion, said spacer having a low etching rate in relation to said first etchant for said first insulating film;

forming a contact hole so as to extend through said first insulating film, using said third insulating film and said spacer as masks;

filling said opening portion and said contact hole with a first conductive material to form a contact plug;

selectively removing said third insulating film using a second etchant whose etching rate to said second insulating film is low, forming a fourth insulating film so as to cover the exposed surfaces of said contact plug and said spacer;

forming a second contact hole in said fourth insulating film so as to expose part of the surface of said contact plug and at least part of the side surface of said spacer;

forming a second conductive material on the side and bottom surfaces of said second contact hole; and selectively removing said fourth insulating film using an etchant whose etching rate to said second conductive material and said second insulating film is low.

7. A method according to claim 6, wherein said first, second, and third insulating films are transparent in relation to visible light.

8. A method according to claim 7, wherein said first insulating film is a silicon oxide film, said second insulating film is a silicon nitride film which grew through a low-pressure chemical vapor deposition process, and said third insulating film is a silicon nitride film which grew through a plasma chemical vapor deposition process.

9. A method according to claim 8, wherein said silicon nitride film which grew through said plasma chemical vapor deposition process, is removed with an aqueous solution of hydrofluoric acid, using, as an etching stopper, said silicon nitride film which grew through said low-pressure chemical vapor deposition process.

10. A method according to claim 8, wherein the thickness of said silicon nitride film which grew through said plasma chemical vapor deposition process, is eight times or less that of said silicon nitride film which grew through said low-pressure chemical vapor deposition process.

11. A method of manufacturing a semiconductor device, comprising the steps of:

forming a first insulating film above a semiconductor substrate;

forming a second insulating film on said first insulating film;

forming a third insulating film on said second insulating film, said third insulating film having a low etching rate in relation to a first etchant for said first insulating film;

forming an opening portion so as to extend through said third and second insulating films up to said first insulating film;

forming a spacer on the side wall of said opening portion, said spacer having a low etching rate in relation to said first etchant for said first insulating film;

forming a contact hole so as to extend through said first insulating film, using said third insulating film and said spacer as masks;

filling said opening portion and said contact hole with a first conductive material to form a contact plug;

selectively removing said third insulating film using a second etchant whose etching rate to said second insulating film is low;

forming a fourth insulating film so as to cover the exposed surfaces of said contact plug and said spacer;

forming a second contact hole in said fourth insulating film so as to expose part of the surface of said contact plug and at least part of the side surface of said spacer;

forming a second conductive material on the side and bottom surfaces of said second contact hole; and selectively removing said fourth insulating film using an etchant whose etching rate to said second conductive material and said second insulating film is low, wherein said second conductive material is used as a storage node of DRAM.

12. A method according to claim 11, wherein said first, second, and third insulating films are transparent in relation to visible light.

13. A method according to claim 12, wherein said first insulating film is a silicon oxide film, said second insulating film is a silicon nitride film which grew through a low-pressure chemical vapor deposition process, and said third insulating film is a silicon nitride film which grew through a plasma chemical vapor deposition process.

14. A method according to claim 13, wherein said silicon nitride film which grew through said plasma chemical vapor deposition process, is removed with an aqueous solution of hydrofluoric acid, using, as an etching stopper, said silicon nitride film which grew through said low-pressure chemical vapor deposition process.

15. A method according to claim 13, wherein the thickness of said silicon nitride film which grew through said plasma chemical vapor deposition process, is eight times or less that of said silicon nitride film which grew through said low-pressure chemical vapor deposition process.

* * * * *